(12) United States Patent
Sugita et al.

(10) Patent No.: US 6,531,732 B2
(45) Date of Patent: Mar. 11, 2003

(54) NONVOLATILE SEMICONDUCTOR MEMORY DEVICE, PROCESS OF MANUFACTURING THE SAME AND METHOD OF OPERATING THE SAME

(75) Inventors: Yasuhiro Sugita, Tenri (JP); Yoshimitsu Yamauchi, Nabari (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/897,434

(22) Filed: Jul. 3, 2001

(65) Prior Publication Data

US 2002/0041526 A1 Apr. 11, 2002

(30) Foreign Application Priority Data

Jul. 3, 2000 (JP) .................................... 2000-201115

(51) Int. Cl.[7] ............................................. H01L 29/788
(52) U.S. Cl. ........................ 257/315; 257/316; 257/319
(58) Field of Search ................................. 257/315, 316, 257/319; 357/23.5; 365/185; 438/257, 301

(56) References Cited

U.S. PATENT DOCUMENTS 4,990,979 A * 2/1991 Otto
5,278,439 A * 1/1994 Ma et al.
5,412,600 A * 5/1995 Nakajima
6,337,250 B2 * 1/2002 Furuhata

OTHER PUBLICATIONS

Boaz Eitan et al., Extended Abstracts of the 1999 International Conference on Solid State Devices and Materials, pp. 522–523, "Can NROM, a 2 Bit, Trapping Storage NVM Cell, Give a Real Challenge to Floating Gate Cells?".

* cited by examiner

Primary Examiner—David Nelms
Assistant Examiner—Dao H. Nguyen
(74) Attorney, Agent, or Firm—Nixon & Vanderhye P.C.

(57) ABSTRACT

A nonvolatile semiconductor memory device comprises: a pair of impurity diffusion layers formed on a surface of a semiconductor substrate; two control gates formed on the semiconductor substrate through the intervention of a charge accumulating layer, the two control gates being provided between the pair of impurity diffusion layers and adjacent to each of the impurity diffusion layers; a word gate transistor including a word line formed on the semiconductor substrate through the intervention of a word gate insulating film between the control gates, wherein the two control gates and the word gate transistor are connected in series to form a unit cell.

10 Claims, 17 Drawing Sheets

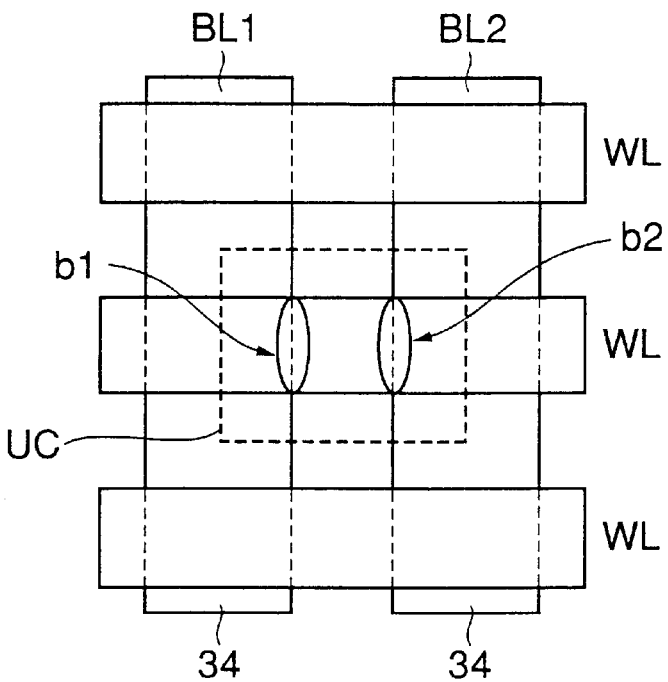
Fig. 17 (a) prior art
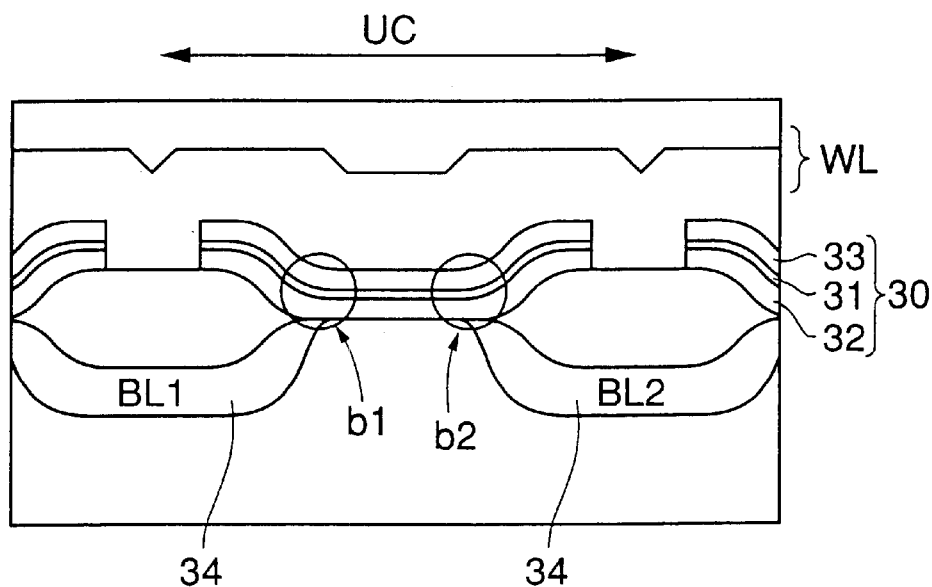
Fig. 17 (b) prior art

NONVOLATILE SEMICONDUCTOR MEMORY DEVICE, PROCESS OF MANUFACTURING THE SAME AND METHOD OF OPERATING THE SAME

CROSS-REFERENCE TO RELATED APPLICATION

This application is related to Japanese application No. 2000-201115 filed on Jul. 3, 2000, whose priority is claimed under 35 USC §119, the disclosure of which is incorporated by reference in its entirety.

BACKGROUND OF THE INVENTION

1. Field of the Invention

The present invention relates to a nonvolatile semiconductor memory device, a process of manufacturing the same and a method of operating the same. In particular, it relates to an electrically writable and erasable nonvolatile semiconductor memory device having a charge accumulating region, a process of manufacturing the same and a method of operating the same.

2. Description of Related Art

As one of nonvolatile semiconductor memory devices, there has been known a 2-bit flash cell of MONOS (Metal Oxide Nitride Oxide Semiconductor) type referred to as NROM in which charges are accumulated in an ONO film comprising a layered structure of an oxide film/a nitride film/an oxide film (Boaz Eitan et al., Extended Abstracts of the 1999 International Conference on Solid State Devices and Materials, pp. 522–523).

FIGS. 17(a) and 17(b) shows a structure of the NROM cell in which a gate insulating film 30 in an n-channel MOSFET is replaced with an ONO film comprising a silicon nitride film 31 as a charge accumulating material sandwiched between two silicon oxide films 32 and 33. The silicon oxide films 32 and 33 sandwiching the silicon nitride film 31 each have a thickness of about 50 Å or more to avoid a direct tunneling phenomenon. The NROM cell shows a virtually grounded structure and thus a bit line 34 functions as a source of one transistor and a drain of another transistor.

In the NROM cell, accumulated charges are detected as physically separated two bits in accordance with a particular method described below.

To write data in a bit 1 (b1) shown in FIGS. 17(a) and 17(b), voltages of 0V, 4.5V and 9V are applied to a bit line 2 (BL2), a bit line 1 (BL1) and a word line (WL), respectively, to turn the MOSFET on. Accordingly, electrons are injected and accumulated in the silicon nitride film 31 near the bit line 1, i.e., the bit 1.

Further, to read the written data from the bit 1, voltages of 1.5V, 0V and 3V are applied to the bit line 2, the bit line 1 and the word line, respectively. At this stage, a threshold voltage increases immediately below the bit 1 due to electrons injected in the bit 1, which reduces a read current. Accordingly, data reading can be performed by detecting the reduction of the read current.

Data writing and reading for a bit 2 (b2) can be performed by switching the voltages applied to the bit lines 1 and 2.

In a device wherein a minimum gate length is about 0.35 $\mu$m, the width of the charge accumulating region is as small as 100 Å or less, so that charges in one bit does not influences those in another bit.

On the other hand, data erasing is performed by injecting holes to the silicon nitride film 31 through the underlying silicon oxide film 32. For example, to erase data from the bit 1 shown in FIGS. 17(a) and 17(b), voltages of 8V, 3V and 0V are applied to the bit line 1, the bit line 2 and the word line, respectively. Accordingly, holes are generated by a tunneling phenomenon between bands, accelerated by a lateral electric field and injected to the silicon nitride film 31 through the lower silicon oxide film 32. Thus, data in the bit 1 is erased.

In the above-mentioned NROM cell, the two bits (b1 and b2) are controlled by one gate voltage (the word line). That is, the selected cell and a cell adjacent thereto are located between a source and a drain (between the bit lines) so that the same voltage is applied to the cells by one word line, which deteriorates reading precision. With the deteriorated reading precision, a margin for data reading is also reduced so that slight movement of electrons and holes causes erroneous reading. Thus, the device becomes less reliable.

Further, where an effective channel length is reduced in accordance with the progress of miniaturization of the semiconductor device, a distance between adjacent bits is reduced and lateral movement of electrons and holes tends to influence the device. That is, charges in one bit influence those in another bit. Accordingly, erroneous reading is caused, control of writing and erasing becomes difficult, the number of verification increases and an accurate voltage control is required. This results in a decrease of writing and erasing speeds.

Further, the data writing is carried out by hot electron injection so that writing is slow and power consumption is great.

SUMMARY OF THE INVENTION

In view of the above-described problems, the present invention has been achieved to provide a nonvolatile semiconductor memory device of improved reading precision wherein a plurality of bits formed between a pair of impurity diffusion layers are controlled by the same or different gate voltage(s) using gate electrodes each corresponding to the bits, a process of manufacturing the device and a method of operating the device.

According to the present invention, provided is a nonvolatile semiconductor memory device comprising: a pair of impurity diffusion layers formed on a surface of a semiconductor substrate;

two control gates formed on the semiconductor substrate through the intervention of a charge accumulating layer, the two control gates being provided between the pair of impurity diffusion layers and adjacent to each of the impurity diffusion layers;

a word gate transistor including a word line formed on the semiconductor substrate through the intervention of a word gate insulating film-between the control gates, wherein the two control gates and the word gate transistor are connected in series to form a unit cell.

Further, according to the present invention, provided is a process of manufacturing a nonvolatile semiconductor memory device comprising the steps of: (a) forming at least two of device isolation films parallel to each other along the X-axis on a semiconductor substrate;

(b) depositing an ONO film, a polysilicon film for control gates and a silicon nitride film successively on the semiconductor substrate including the device isolation films and patterning them into a desired configuration to form at least two of control gates parallel to each other along the Y-axis;

(c) forming a plurality of impurity diffusion layers which are parallel to each other along the Y-axis and adjacent to the control gates;

(d) forming an oxide film on the impurity diffusion layers and between the control gates to bury the oxide film between the control gates;

(e) removing the oxide film buried between the control gates; and (f) forming a word gate transistor between the control gates.

The present invention further provides a method of writing data in the above-described nonvolatile semiconductor memory device comprising:

applying a predetermined positive voltage to one of the impurity diffusion layers;

applying a voltage higher than the voltage applied to the impurity diffusion layer to one of the control gates adjacent to the impurity diffusion layer, or a voltage almost equal to the voltage applied to the impurity diffusion layer to one of the, control gates adjacent to the impurity diffusion layer;

applying a voltage higher than a threshold voltage of other control gate to the other control gate; and applying a voltage almost equal to a threshold voltage of the word gate transistor to the word gate to write data in a bit corresponding to said one control gate.

The present invention further provides a method of erasing data from the above-described nonvolatile semiconductor memory device comprising: applying a predetermined negative voltage to one of the control gates, and grounding the substrate or applying a predetermined positive voltage to the substrate or applying a predetermined positive voltage to an impurity diffusion layer adjacent to said one control gate to erase data from a bit corresponding to said one control gate.

The present invention further provides a method of reading data from the above-described nonvolatile semiconductor memory device comprising: applying a predetermined positive voltage to one of the impurity diffusion layers, applying a predetermined positive voltage to one of the control gates, applying a voltage higher than a threshold voltage of other control gate to the other control gate, and applying a voltage higher than a threshold voltage of the word gate transistor to the word gate to read data from a bit corresponding to said one control gate These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 17(a) is a schematic plan view and FIG. 17(b) is a sectional view of a major part for illustrating a conventional nonvolatile semiconductor memory device.

DESCRIPTION OF THE PREFERRED EMBODIMENTS

Figure 1:
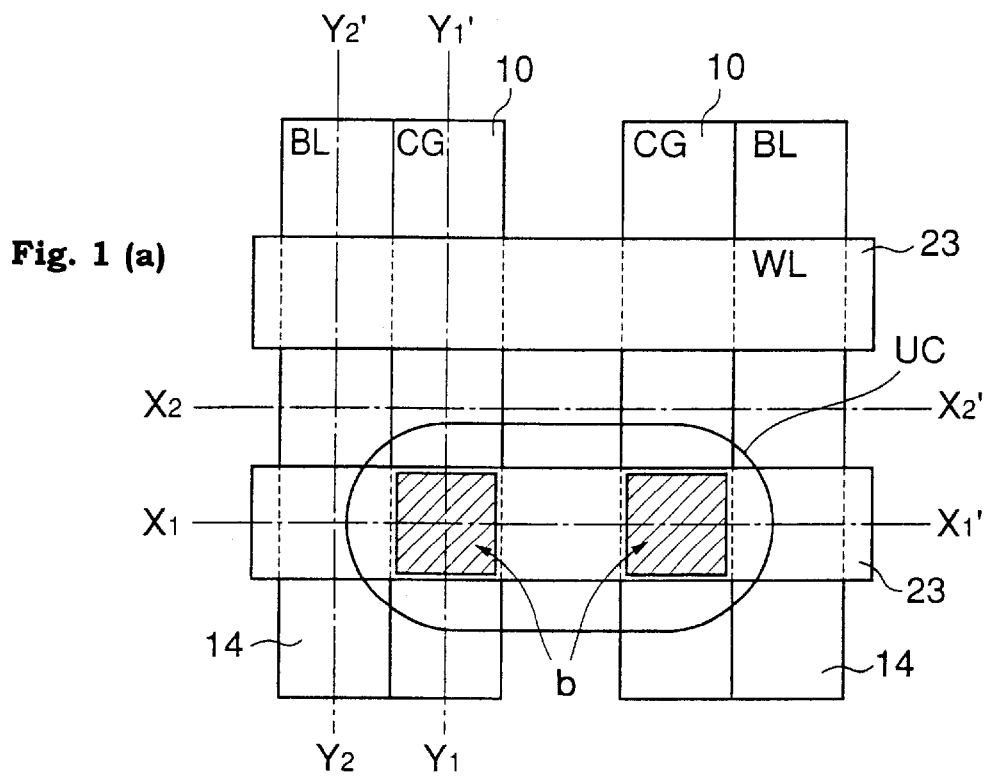
FIG. 1(a) is a schematic plan view and FIGS. 1(b) and 1(c) are sectional views for illustrating an embodiment of a nonvolatile semiconductor memory device according to the present invention.
Figure 1:
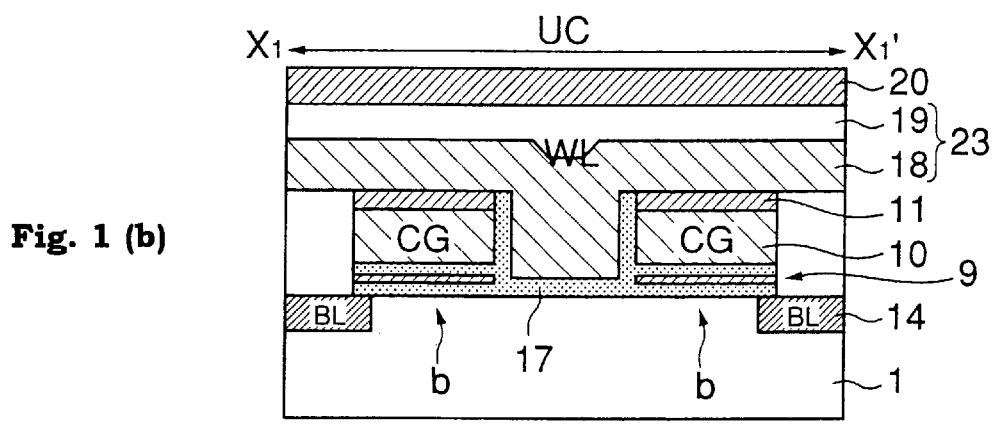

The nonvolatile semiconductor memory device according to the present invention mainly comprises a pair of impurity diffusion layers formed on a surface of a semiconductor substrate, a charge accumulating layer formed on the semiconductor substrate, two control gates and a word gate transistor including a word gate insulating film and a word line formed on the semiconductor substrate.

The semiconductor substrate usable in the nonvolatile semiconductor memory device according to the present invention is not particularly limited as long as it is generally used for semiconductor devices. For example, the substrate may be of an element semiconductor such as silicon, germanium or the like, or a compound semiconductor such as GaAs, InGaAs, ZnSe or the like. Among them a silicon substrate is preferable. On the semiconductor substrate a device isolation region is preferably formed. Other elements such as transistors, capacitors and resistors, interlayer insulating films, circuits including them, semiconductor devices and the like may be combined on the semiconductor substrate to form a single layered or multi-layered structure. The device isolation region may be formed of various device isolation films such as a LOCOS film, a trench oxide film, an STI film and the like. Among them the STI film is preferably used to form the device isolation region.

The impurity diffusion layer formed on the surface of the semiconductor substrate functions as a bit line and preferably a pair or more of them are formed. More preferably, plural impurity diffusion layers are formed parallel to each other along the Y-axis. The width and length of the impurity diffusion layer may suitably be adjusted depending on performance or the like of the nonvolatile semiconductor device to be obtained. The impurity concentration is not particularly limited, but for example, it may be about 1 to $2\times10^{21}/cm^{-3}$. The plural impurity diffusion layers may have the same width, length and impurity concentration, or have alternately, regularly or irregularly varied ones.

The charge accumulating layer formed on the semiconductor substrate is not particularly limited as long as it is made of a material capable of accumulating charges in a semiconductor device. For example, a single layered film made of one material, a layered film made of two or more kinds of materials or the like may be used. Typically, a layered film of a silicon oxide film/a silicon nitride film/a silicon oxide film is used. Various films such as an HTO (high temperature oxide) film, a thermally oxidized film, an LTO (low temperature oxide) film, an HDP (high density plasma)-CVD oxide film and the like may be used as the silicon oxide film. The nitride film may be formed by a known method such as CVD, plasma enhanced CVD or the like. The thickness of the ONO film is not particularly limited but for example, it may be about 4 to 5 nm/7 to 8 nm/6 to 7 nm.

The control gates are preferably formed parallel to each other along the Y-axis between at least a pair of impurity diffusion layers on the semiconductor substrate through the intervention of the charge accumulating layer. The control gates are located adjacent to each of the impurity diffusion layers. The width and length of the control gate may suitably be adjusted depending on performance or the like of the nonvolatile semiconductor device to be obtained. The thickness thereof may be about 50 to 150 nm, for example. The control gate may be formed of any material as long as it is generally used as an electrode. For example, it may be, formed of polysilicon; metal (aluminum, gold, copper, silver, tungsten, tantalum, titanium, cobalt and the like); silicide (tungsten silicide and the like); or a layered film of them (e.g., a layered film of polysilicon and tungsten silicide). Further, the two control gates may preferably be formed of the same material to have the same width, length and thickness. However the material, width, length and thickness may be varied between the two control gates.

The word gate transistor formed on the semiconductor substrate comprises.a word gate insulating film and a word line formed thereon. The above-mentioned pair of impurity diffusion layers function as a source and a drain of the word gate transistor.

The word gate insulating film may be a film generally used as a gate insulating film, e.g., a silicon oxide film, a silicon nitride film or a layered film of them. Among them the silicon oxide film is preferable. With the word gate insulating film made of the silicon oxide film, the charge accumulating layer located below the two control gates is divided. The thickness of the word gate insulating film is not particularly limited but it may be about 10 to 20 nm, for example.

The word line is formed at least between the pair of the impurity diffusion layers and on the word gate insulating film between the two control gates. The word line is preferably extended along the X-axis over the control gate through the intervention of an insulating film and over the semiconductor substrate between the two control gates through the intervention of the word gate insulating film. The word line may be formed of a material selected from the above-mentioned materials of the control gate. The thickness thereof may be about 50 to 150 nm, for example. The width and length of the word line may suitably be adjusted depending on performance or the like of the nonvolatile semiconductor device to be obtained. Further, the insulating film formed on the control gate is to electrically isolate the control gate and the word line, and may be a silicon oxide film, a silicon nitride film or a layered film of them. The thickness thereof may be about 100 to 250 nm, for example.

The word gate transistor is connected in series with the two control gates adjacent thereto to constitute a unit cell together with the two control gate transistors. That is, in the unit cell, the control gates are arranged on both sides of the word line formed via the word gate insulating film so that different control gate voltages are applied to the ONO films below each of the control gates to write, read and erase bit data.

In a conventional technique, two bits provided between a pair of impurity diffusion layers are controlled by the same word gate voltage. Accordingly, if the word gate voltage exceeds a drain voltage, the unit cell constitutes a triode region and a depletion layer is not formed near a drain, so that a bit near a source is influenced by a bit near the drain. In a multivalued memory, a threshold voltage increases and the word gate voltage needs to be raised, which deteriorates reading precision and requires a larger margin for reading. Thus, the multivalued memory has been difficult to obtain. According to the present invention, however, 2-bit data for the two control gates are controlled by the control gate voltages, respectively. Thus, the reading precision improves and multivalued data can easily be processed.

According to a process of manufacturing the nonvolatile semiconductor device of the present invention, in the step (a), a plurality of device isolation regions parallel to each other along the X-axis are formed from an conventional technique on a semiconductor substrate. For example, an STI film is preferably mentioned. The STI film in this context signifies a device isolation film made of an insulating film formed within a relatively shallow trench by an STI method. The thickness and width of the device isolation region (e.g., STI film) may suitably be adjusted depending on performance of the nonvolatile semiconductor memory device to be obtained. More specifically, an insulating film such as a silicon nitride film is formed on the entire surface of the semiconductor substrate and patterned by photolithography and etching to have openings above regions for forming trenches. Then, etching is carried out using the insulating film as a mask to form the trenches of a predetermined depth parallel to each other along the X-axis on the semiconductor substrate.

In the step (b), an ONO film, a polysilicon film for control gates and a silicon nitride film are successively deposited on the semiconductor substrate provided with the device isolation regions. The ONO film, the polysilicon film and the silicon nitride film may be formed by a known method suitably selected from various ones such as thermal oxidation, CVD, plasma enhanced CVD, vapor deposition, sputtering and the like. The silicon nitride film formed in this step will function as a protective film against etching or an etch stopper in a later step and so that it is at least required to be formed thicker than a silicon nitride film comprising the ONO film. More specifically, the thickness thereof may be about 100 to 250 nm.

The thus deposited films are patterned into a desired configuration to form a plurality of control gates parallel to each other along the Y-axis. The patterning may be carried out using a mask formed by photolithography and etching. For patterning the polysilicon film into the control gates, the silicon nitride film on the polysilicon film is also patterned. The patterning is preferably conducted to pattern only the upper silicon oxide film comprising the ONO film so that the silicon nitride film in the ONO film is utilized as a protective film against etching or an etch stopper in a later step.

In the step (c), an impurity diffusion layer is formed. It is preferable to form a plurality of impurity diffusion layers parallel to each other along the Y-axis so that they are adjacent to the control gates, respectively. The impurity diffusion layers in this context may be provided by, for example, ion implantation using a mask pattern of a desired configuration formed by photolithography and etching and the control gates as a mask. The ion implantation is performed by using phosphorus or arsenic to form an n-type impurity diffusion layer, or boron or the like to form a p-type impurity diffusion layer, at a dose of 1 to $5 \times 10^{15}$ cm$^{-2}$ and an acceleration energy of 10 to 40 keV in both cases.

To form the impurity diffusion layers successively along the Y-axis, it is preferable to remove the device isolation region (e.g., STI film), from regions adjacent to the control gates before the ion implantation. The removal of the STI film may be performed by wet etching using an acidic or alkaline solution, or dry etching such as RIE, using a mask for forming the impurity diffusion layers. Where the device isolation region (e.g., STI film) is not removed, the ion implantation may be performed in plural times with varied acceleration energies.

In a following or a later step, thermal treatment is carried out to complete the impurity diffusion layers. The thermal treatment may be performed under suitable control depending on an ion source, a dose employed and the size of the nonvolatile semiconductor memory device to be obtained.

In the step (d), an oxide film is formed on the impurity diffusion layers and between the control gates. First, an oxide film is formed on the entire surface of the semiconductor substrate on which the control gates and the like have been formed and etched back until the surface of the silicon nitride film located on the control gates is exposed. Thus, the oxide film is buried. The oxide film may be an HTO film, a thermally oxidized film, an LTO film, an HDP-CVD oxide film or the like by a known method such as CVD, plasma enhanced CVD or the like. The thickness of the oxide film is preferably greater than a sum of the thicknesses of the STI film, the ONO film, the control gate and the silicon nitride film, for example, about 500 to 700 nm. The etch back may be performed by wet etching, dry etching, CMP or the like, among which CMP is preferable. The silicon nitride film located on the control gate functions as a protective film against the etching or an etch stopper.

In the step (e), the oxide film buried between the control gates between a pair of the impurity diffusion layers is removed. The oxide film may be removed by etching using a resist pattern having an opening above a region from which the oxide film is to be removed. In this case, if the silicon nitride film in the ONO film remains, the silicon nitride film may be used as an etch stopper.

In the step (f), a word gate transistor is formed between the control gates.

If a silicon nitride film, a silicon oxide film and the like are formed in the region from which the oxide film has been removed in the step (e), these films are removed to expose the surface of the semiconductor substrate.

Then, a word gate insulating film is formed on the thus exposed semiconductor substrate. The word gate insulating film may be formed by a known method such as thermal oxidation, CVD or the like. The word gate insulating film is preferably formed not only on the exposed semiconductor substrate, but to cover the sidewalls of the control gates.

Then, on the entire surface of the thus obtained semiconductor substrate a conductive material for a word line is formed and patterned into a desired configuration. The patterning is carried out by providing a silicon nitride film of a desired configuration on the conductive material as a mask and etching the conductive material using the mask. The silicon nitride film of the desired configuration may have sidewall spacers of a silicon nitride film on its sidewalls so that a misalignment margin for the patterning of the conductive material into the word line is enlarged.

Accordingly, the word line extending along the X-axis is formed over the control gate through the intervention of the insulating film and over the semiconductor substrate between the control gates through the intervention of the word gate insulating film. Thus, the word gate transistor is completed.

In the process of manufacturing the nonvolatile semiconductor memory device of the present invention, doping of impurities, ion implantation for adjusting the threshold voltage, thermal treatment, formation of insulating films, formation of contact holes and/or formation of wiring layers may be performed before, during or after any step in the above-mentioned process to complete the nonvolatile semiconductor memory device.

According to the method of operating the nonvolatile semiconductor memory device of the present invention, in the above-described nonvolatile semiconductor device, a predetermined positive voltage (Vd) is applied to one of the pair of impurity diffusion layers (D), a voltage (Vcg1) higher than the voltage (Vd) applied to the impurity diffusion layer (D) is applied to one of the control gates (CG1) adjacent to the impurity diffusion layer (D), a voltage (Vcg2) higher than a threshold voltage of the other control gate (CG2) is applied to the other control gate (CG2), and a voltage ($V_w$) almost equal to a threshold voltage of the word gate transistor is applied to the word gate.

The voltage applied to the one of the control gates is preferably higher than the voltage applied to the one of the impurity diffusion layers, because the higher the voltage applied to the control gate is as compared with that applied to the impurity diffusion layer, the greater the efficiency of electron injection increases (Vcg1>>Vd).

The voltage applied to the other control gate is preferably higher than a threshold voltage of the other control gate, i.e., a voltage higher than a voltage with which the transistor including the other control gate is turned on, or a voltage obtaining an inversion layer under the other control gate (Vcg2>Vth).

The word gate voltage may be a voltage close to a threshold voltage of the word gate transistor. That is, the word gate voltage is set to a voltage with which the word gate transistor is turned on (Vw≈Vth).

The one impurity diffusion layer, the one control gate, the other control gate and the word gate may be applied with voltages of about 4 to 6V, 8 to 10V, 3 to 5V and 1 to 2V, respectively.

Accordingly, data is written in a bit corresponding to the one control gate. The data writing method is generally called to source side injection, which shows higher injection efficiency by about three digits than the following channel hot electron method and thus improves writing speed.

According to another method of operating the nonvolatile semiconductor device, in the above-mentioned nonvolatile semiconductor device, a predetermined positive voltage (Vd) is applied to one of the impurity diffusion layers (D), a voltage (Vcg1) almost equal to the voltage (Vd) applied to the impurity diffusion layer (D) is applied to one of the control gates (CG1) adjacent to the impurity diffusion layer (D), a voltage (Vcg2) higher than a threshold voltage of the other control gate (CG2) is applied to the other control gate (CG2) and a voltage ($V_w$) higher than a threshold voltage of the word gate transistor is applied to the word gate.

The voltage applied to the one control gate is preferably almost equal to the voltage applied to the one impurity diffusion layer (Vcg1≈Vd) since it exhibits the highest electron injection efficiency.

The voltage applied to the other control gate is preferably higher than the threshold voltage of the other control gate, i.e., higher than a voltage with which the transistor including the other control gate is turned on, or a voltage obtaining an inversion layer under the other control gate (Vcg2>Vth).

The voltage applied to the word gate is preferably higher than the threshold voltage of the word gate transistor, i.e., higher than a voltage with which the word gate transistor is turned on (Vw>Vth).

The one impurity diffusion layer, the one control gate, the other control gate and the word gate may be applied with voltages of about 4 to 6V, 4 to 6V, 3 to 5V and 3 to 4V, respectively.

Accordingly, data is written in a bit corresponding to the one control gate. The data writing method is generally called to channel hot electron injection.

Further, according to the method of operating the nonvolatile semiconductor memory device of the present invention, in the above-described nonvolatile semiconductor device, a predetermined negative voltage (Vcg1) is applied to one of the control gates (CG1) and the substrate is grounded or applied with a predetermined positive voltage.

The voltages to be applied to the one control gate and the substrate may be about −5 to −12V and about 0 to 5 V, respectively.

Accordingly, data is erased from a bit corresponding to the one control gate. The data erasing method is generally called as FN tunneling erasure.

Still further, according to another operating method, a predetermined negative voltage (Vcg1) is applied to one of the control gates (CG1) and a predetermined positive voltage (Vd) is applied to an impurity diffusion layer (D) adjacent to the control gate (CG1).

The one control gate and the impurity diffusion layer adjacent to the control gate may be applied with voltages of about −4 to −7V and about 5 to 6V, respectively.

Accordingly, data is erased from a bit corresponding to the one control gate. The data erasing method is generally called as band-to-band tunneling erasure.

According to the method of operating the nonvolatile semiconductor memory device of the present invention, in the above-mentioned nonvolatile semiconductor device, a predetermined positive voltage (Vd) is applied to one of the pair of impurity diffusion layers (D), a predetermined voltage (Vcg1) is applied to one of the control gates (CG1), a voltage (Vcg2) higher than a threshold voltage of a transistor including the other control gate (CG2) is applied to the other control gate (CG2), and a voltage ($V_w$) higher than a threshold voltage of the word gate transistor is applied to the word gate.

The one impurity diffusion layer, the one control gate, the other control gate, and the word gate may be applied with voltages of about 1 to 2V, 0 to 5V, 3 to 5V and 3 to 4V, respectively.

Accordingly, data is read from a bit corresponding to the one control gate.

Hereinafter, an example of the nonvolatile semiconductor memory device of the present invention, the process of manufacturing the same, and the method of operating the same will be described with reference to the figures.

Figure 1C:
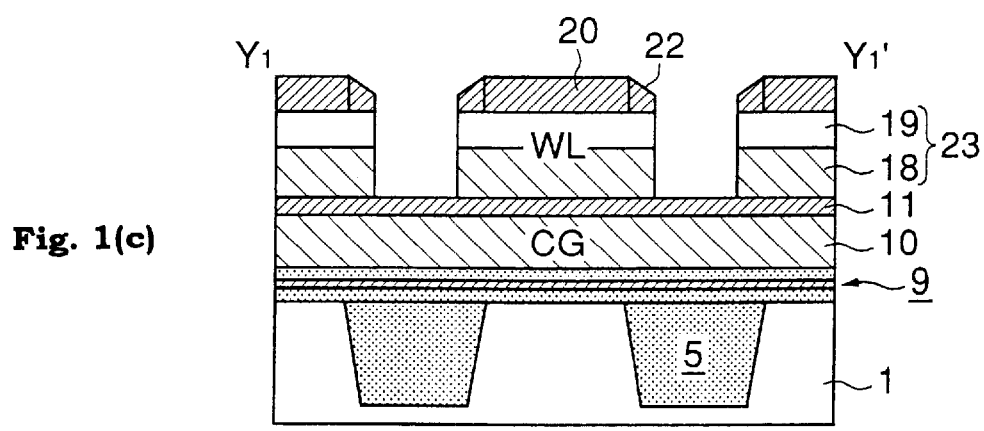
Figure 2:
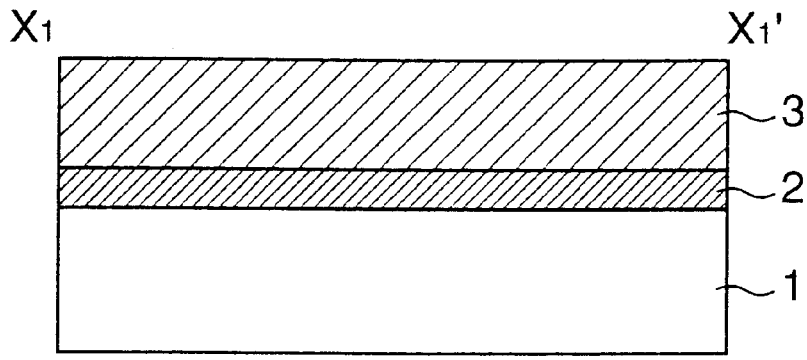
FIGS. 2(a) to 2(d) are schematic sectional views of a major part for illustrating a manufacturing process of the nonvolatile semiconductor memory device of FIG. 1.
Figure 2:
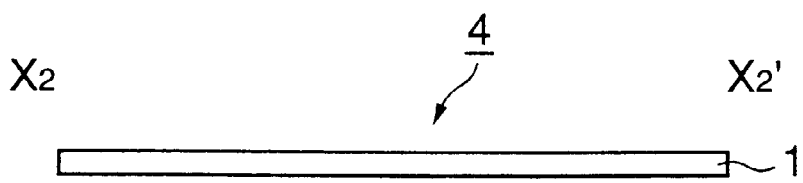
Figure 2:
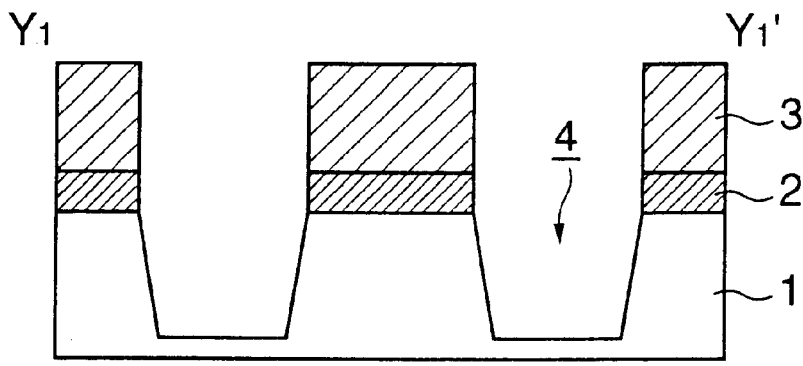
Figure 2:
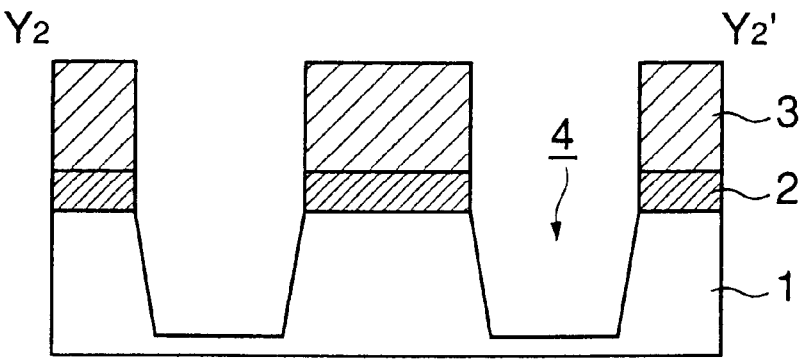
Figure 3:
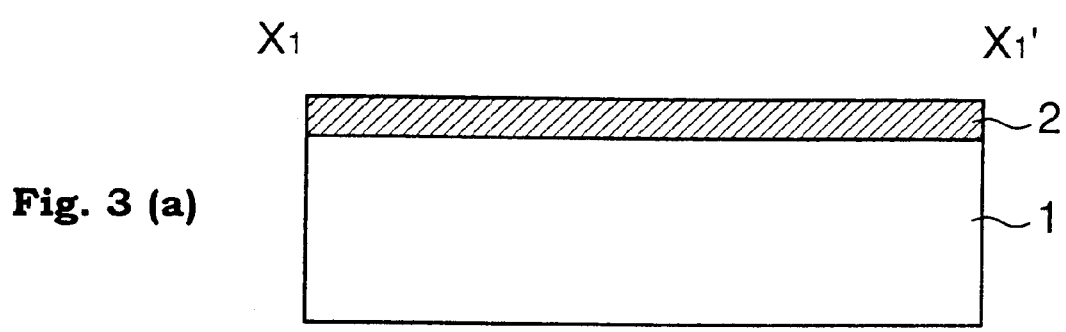
FIGS. 3(a) to 3(d) are schematic sectional views of a major part for illustrating a manufacturing process of the nonvolatile semiconductor memory device of FIG. 1.
Figure 3:
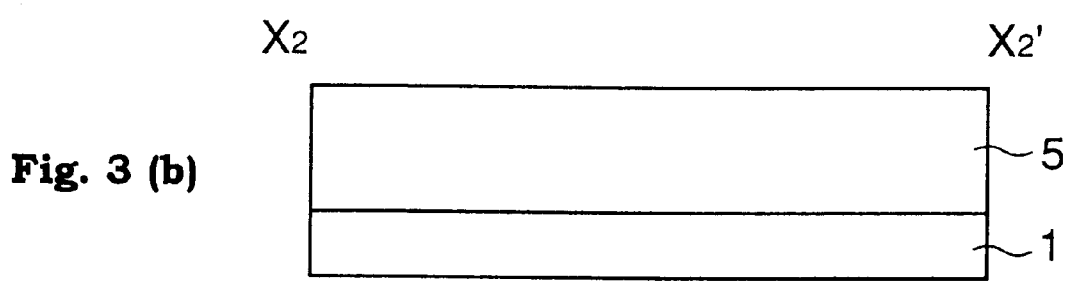
Figure 3:
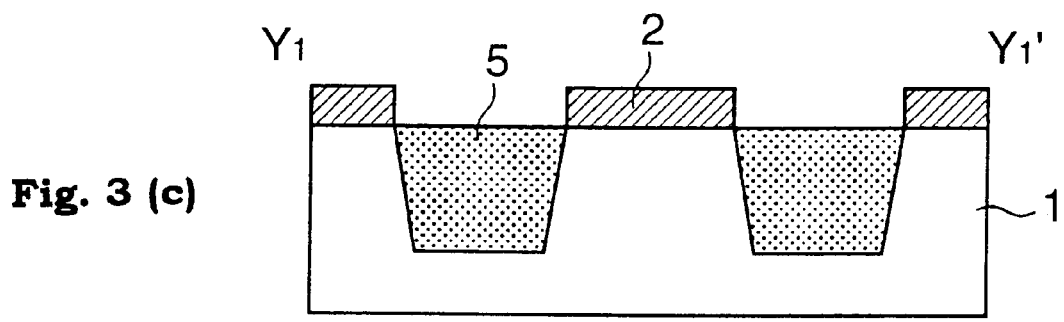
Figure 3:
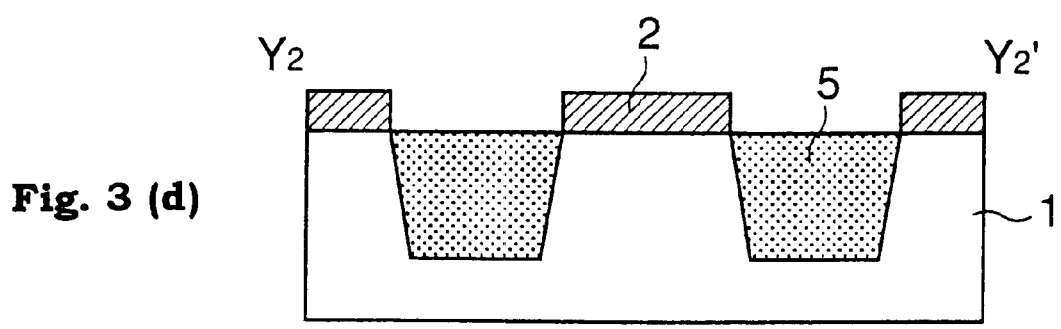
Figure 4:
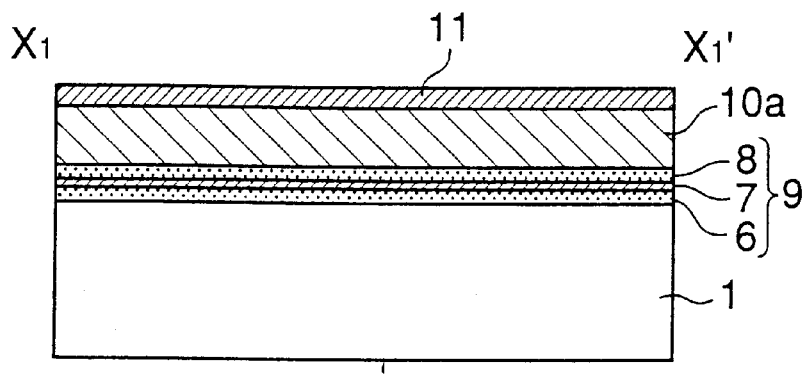
FIGS. 4(a) to 4(d) are schematic sectional views of a major part for illustrating a manufacturing process of the nonvolatile semiconductor memory device of FIG. 1.
Figure 4:
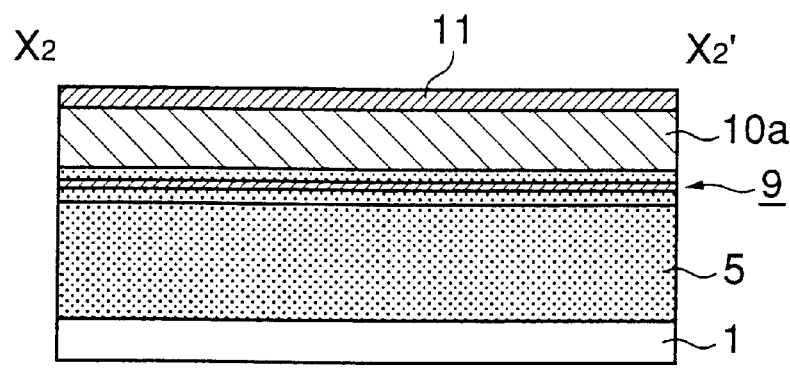
Figure 4C:
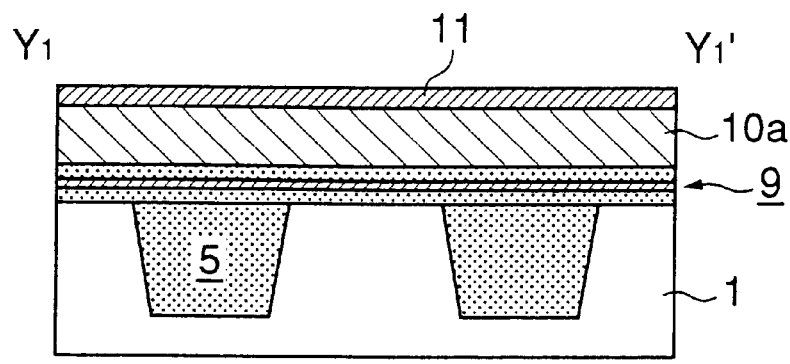
Figure 4:
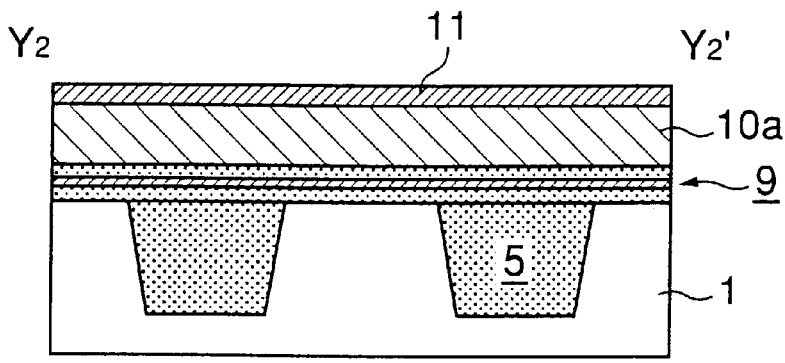
Figure 5:
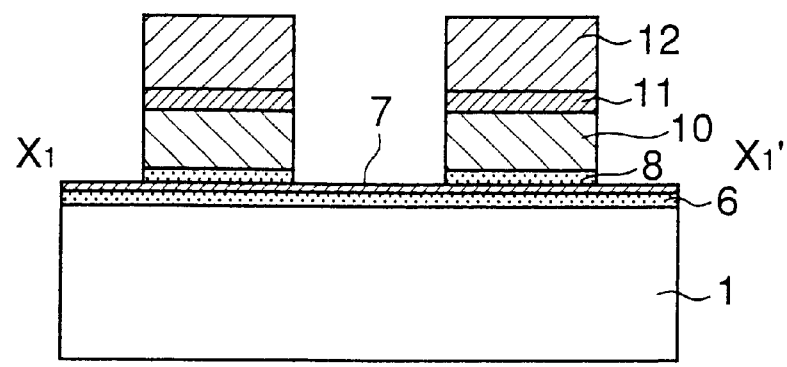
FIGS. 5(a) to 5(d) are schematic sectional views of a major part for illustrating a manufacturing process of the nonvolatile semiconductor memory device of FIG. 1.
Figure 5:
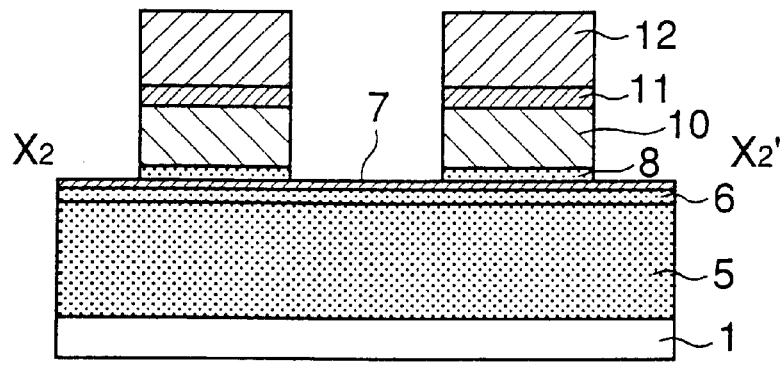
Figure 5:
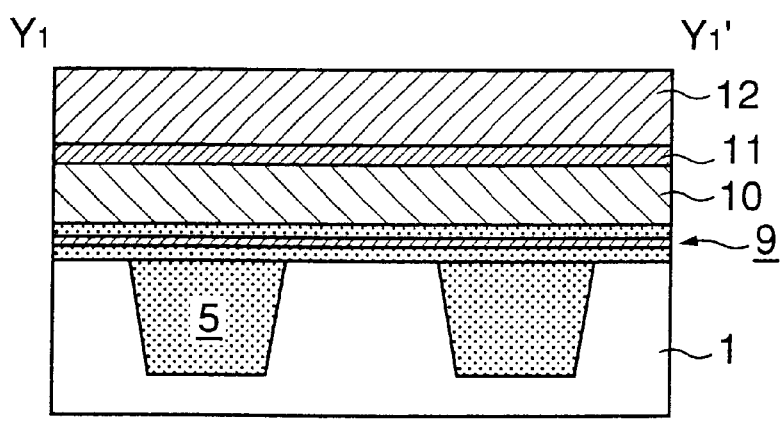
Figure 5:
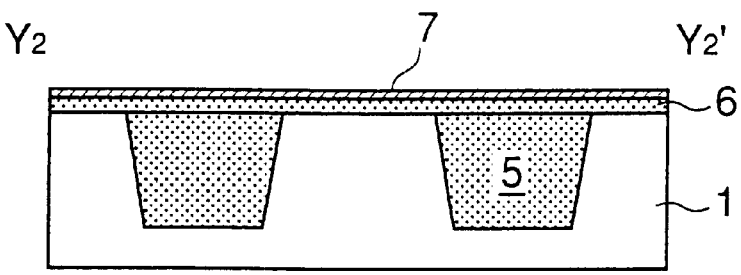
Figure 6:
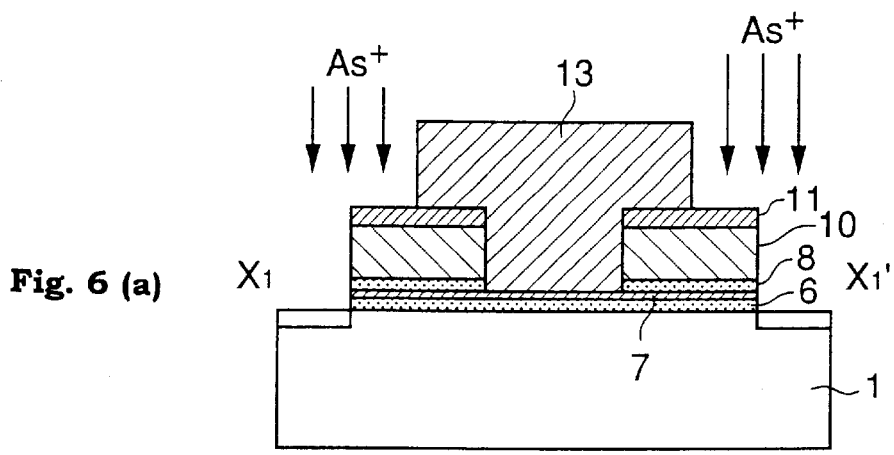
FIGS. 6(a) to 6(d) are schematic sectional views of a major part for illustrating a manufacturing process of the nonvolatile semiconductor memory device of FIG. 1.
Figure 6:
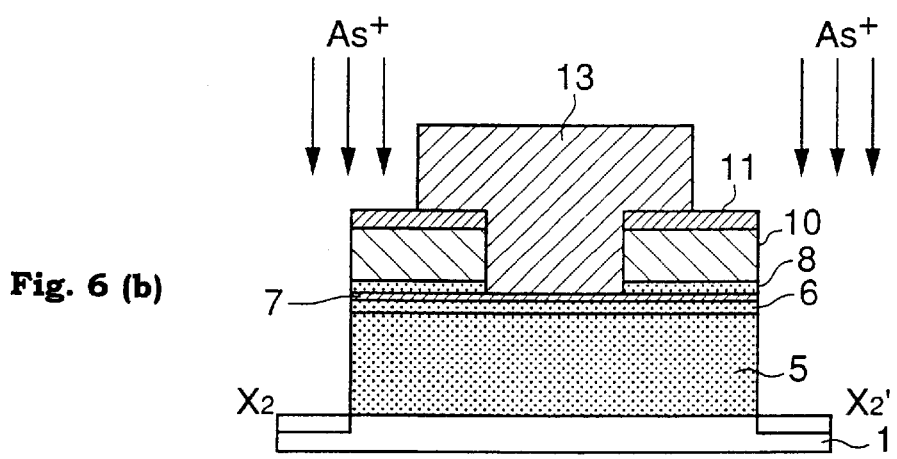
Figure 6:
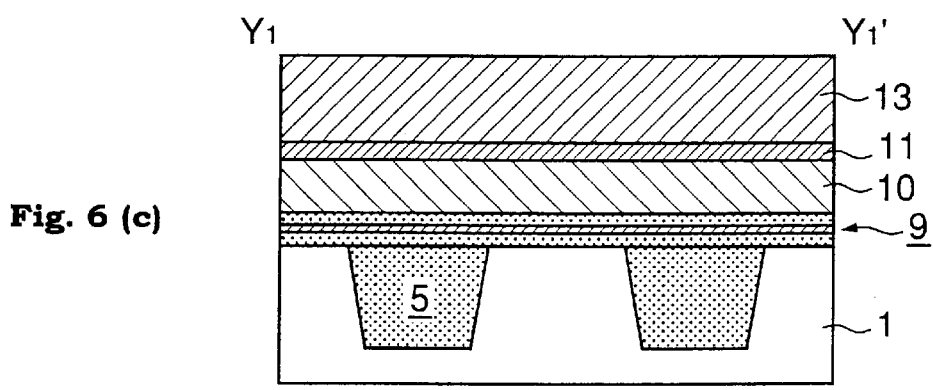
Figure 6:
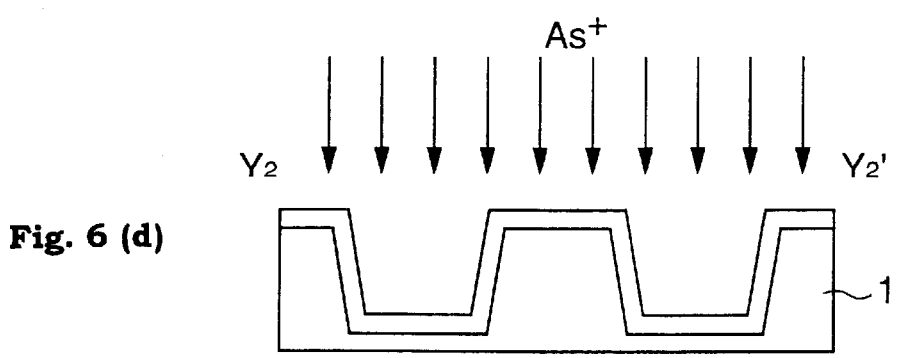
Figure 7:
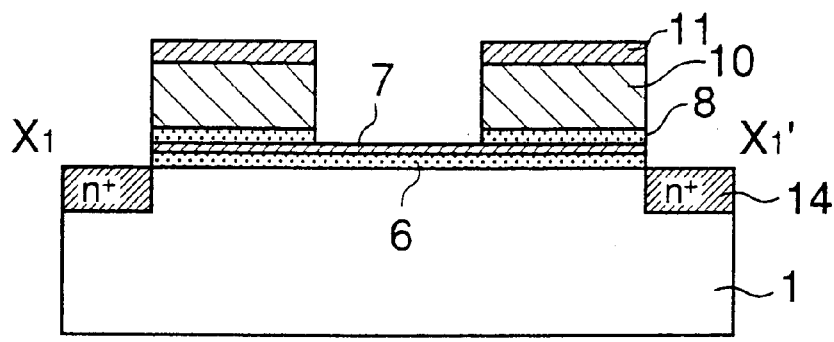
FIGS. 7(a) to 7(d) are schematic sectional views of a major part for illustrating a manufacturing process of the nonvolatile semiconductor memory device of FIG. 1.
Figure 7:
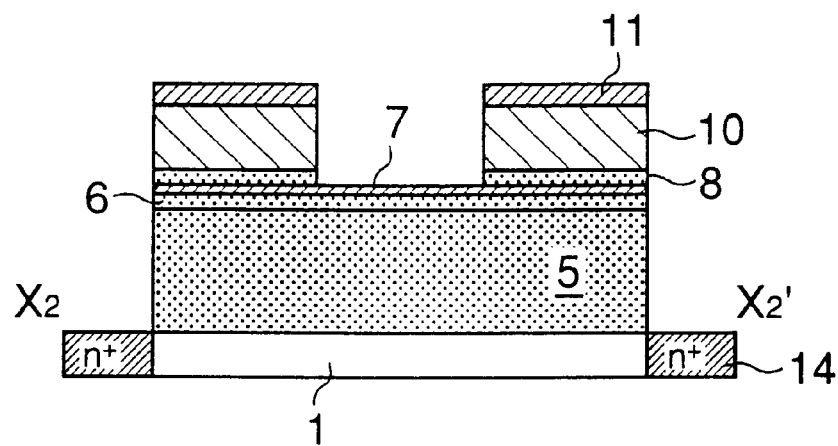
Figure 7:
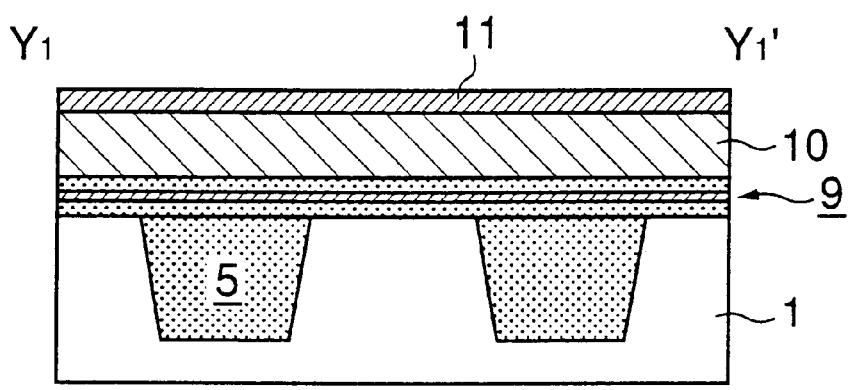
Figure 7:
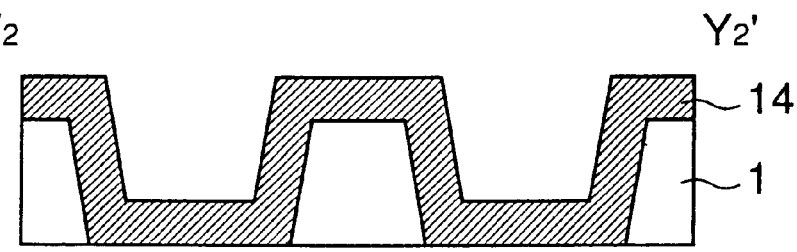
Figure 8:
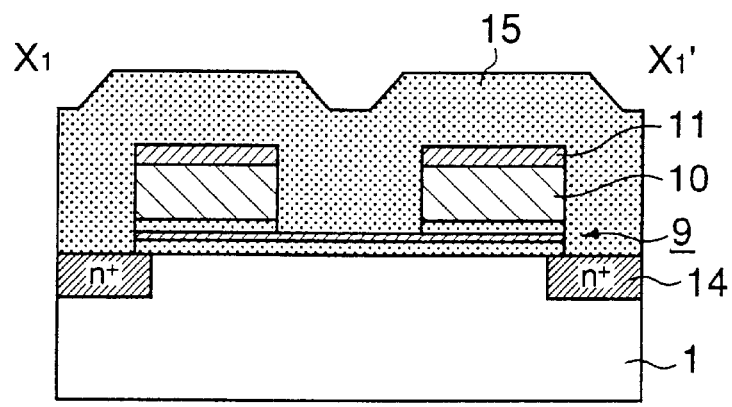
FIGS. 8(a) to 8(d) are schematic sectional views of a major part for illustrating a manufacturing process of the nonvolatile semiconductor memory device of FIG. 1.
Figure 8:
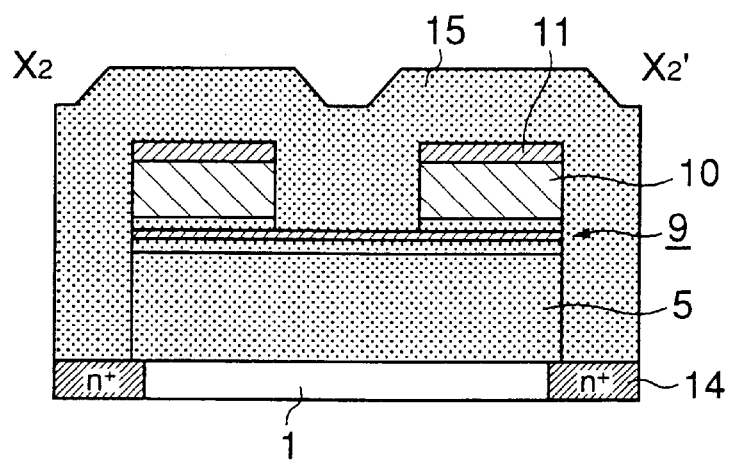
Figure 8:
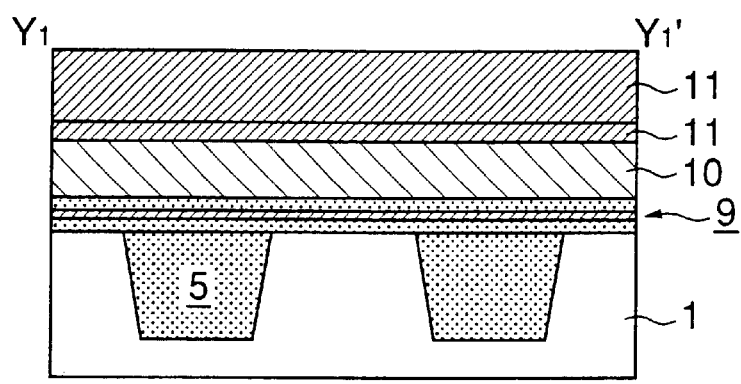
Figure 8:
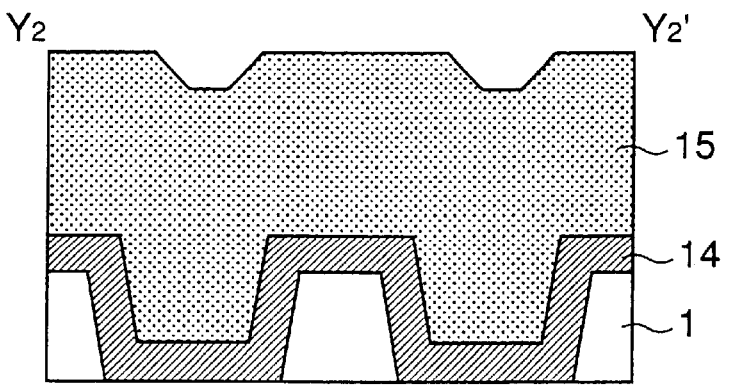
Figure 9:
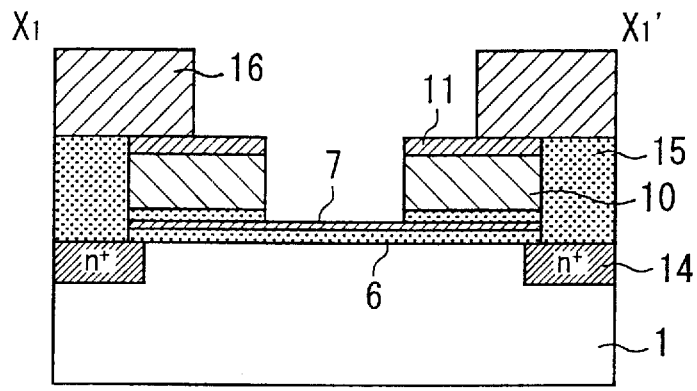
FIGS. 9(a) to 9(d) are schematic sectional views of a major part for illustrating a manufacturing process of the nonvolatile semiconductor memory device of FIG. 1.
Figure 9:
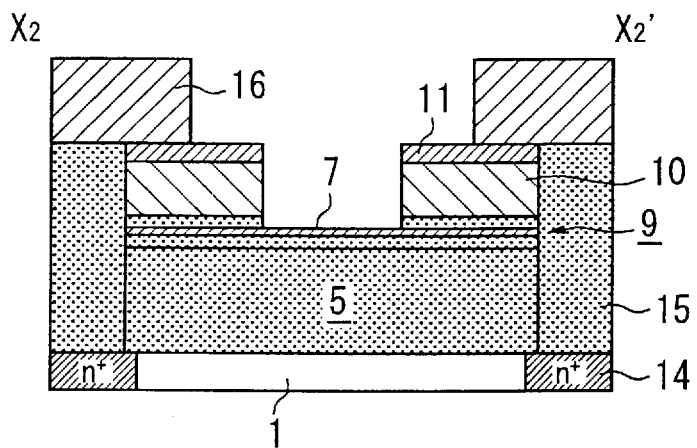
Figure 9:
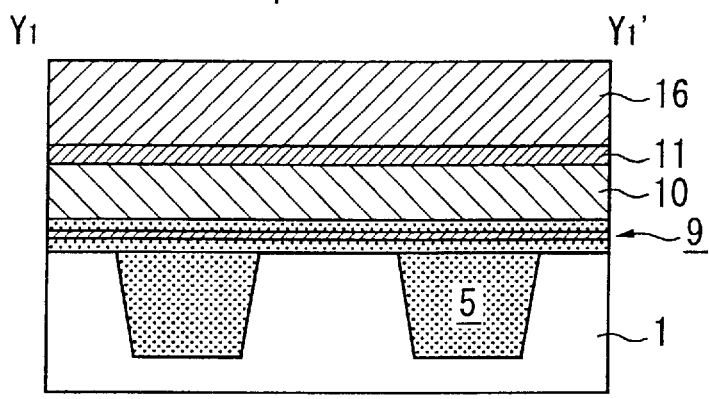
Figure 9:
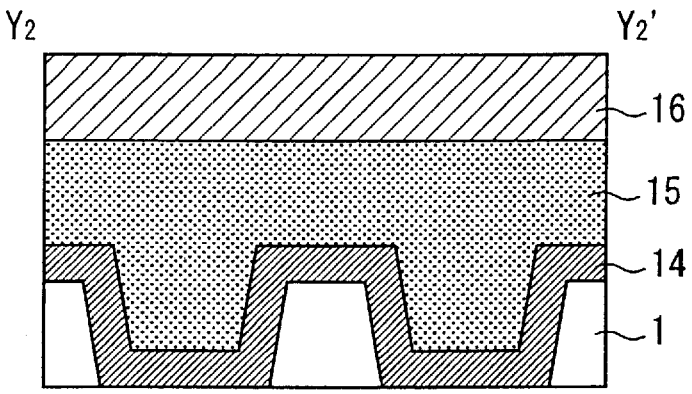
Figure 10:
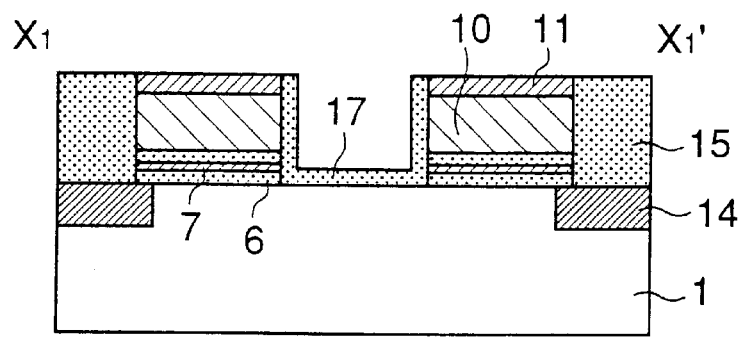
FIGS. 10(a) to 10(d) are schematic sectional views of a major part for illustrating a manufacturing process of the nonvolatile semiconductor memory device of FIG. 1.
Figure 10:
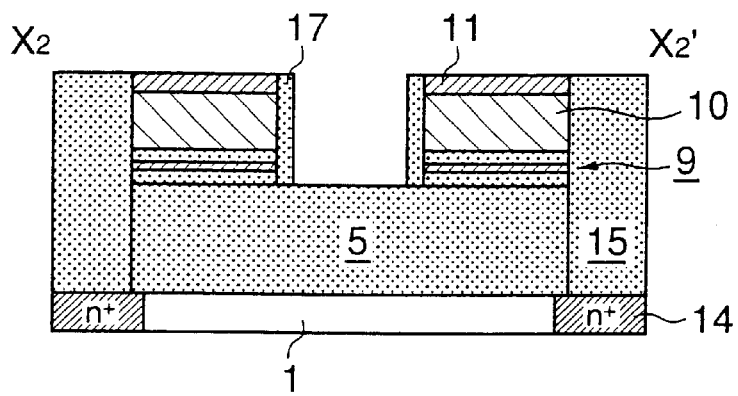
Figure 10:
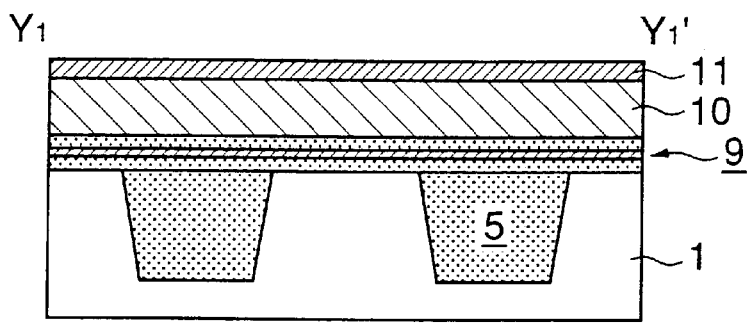
Figure 10:
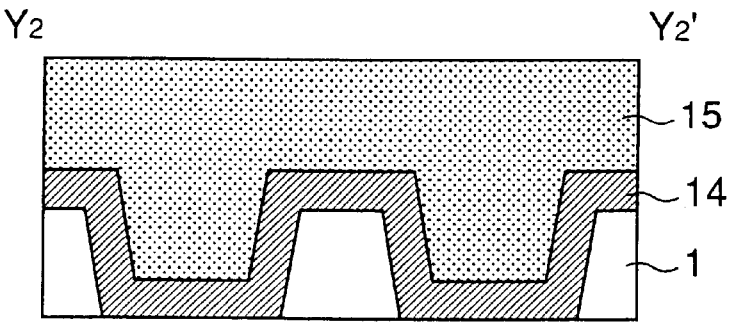
Figure 11:
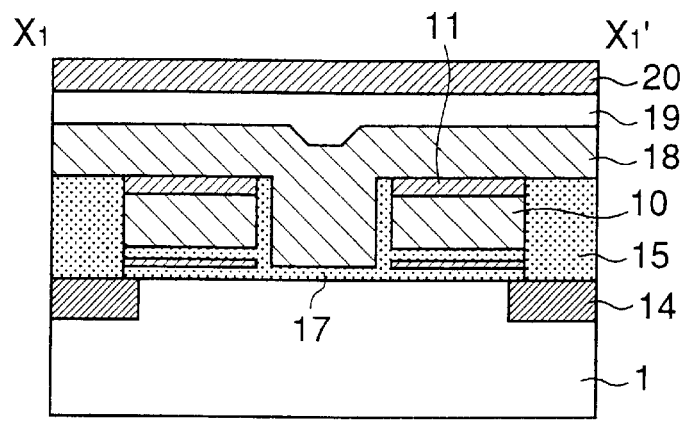
FIGS. 11(a) to 11(d) are schematic sectional views of a major part for illustrating a manufacturing process of the nonvolatile semiconductor memory device of FIG. 1.
Figure 11:
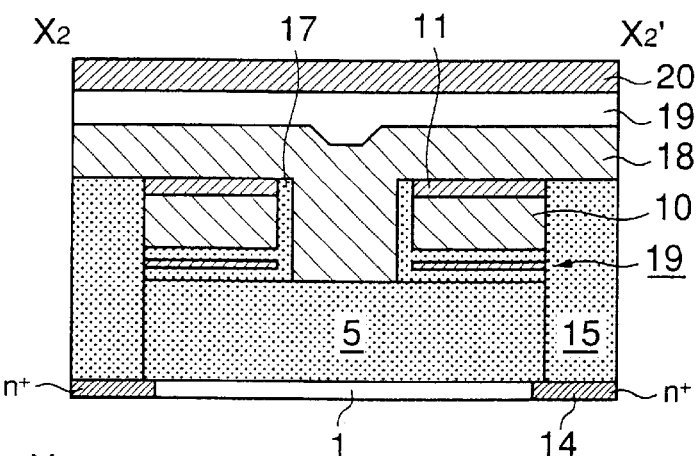
Figure 11:
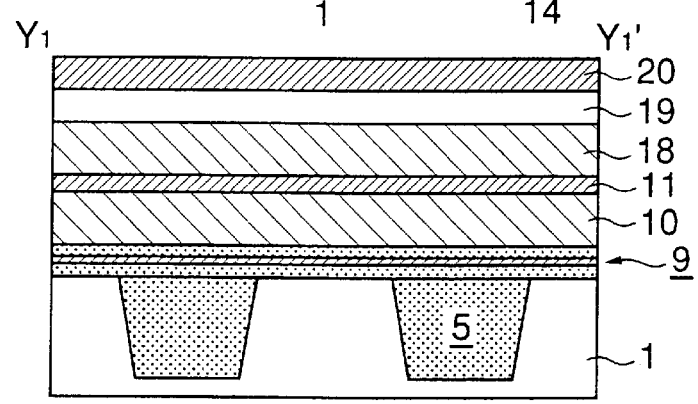
Figure 11:
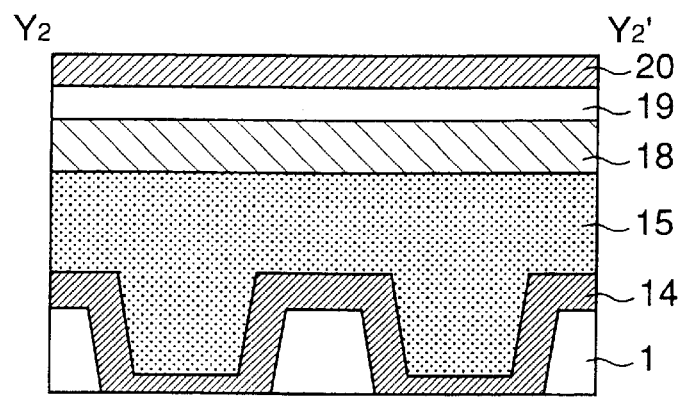
Figure 12:
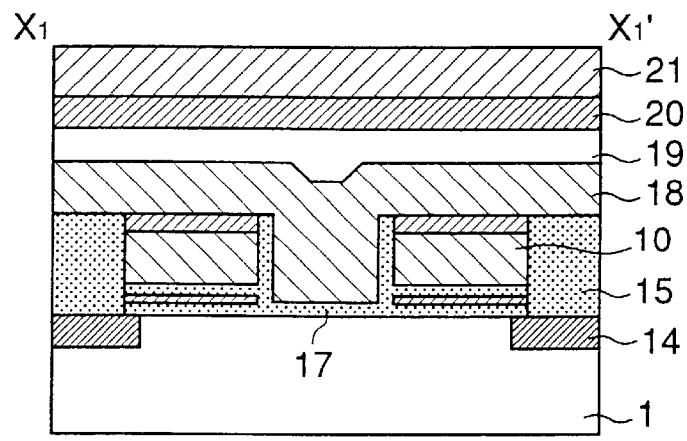
FIGS. 12(a) to 12(d) are schematic sectional views of a major part for illustrating a manufacturing process of the nonvolatile semiconductor memory device of FIG. 1.
Figure 12:
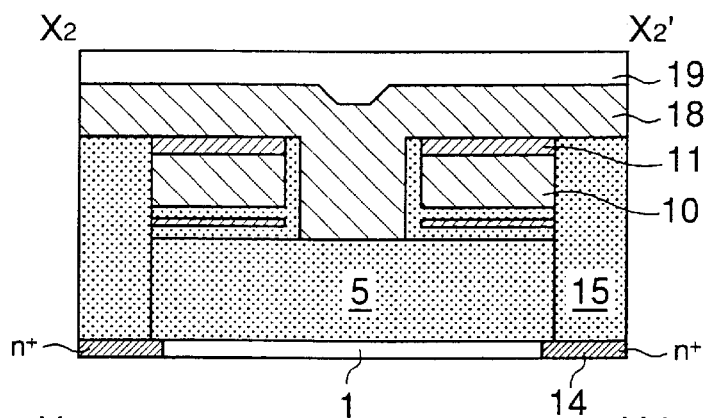
Figure 12:
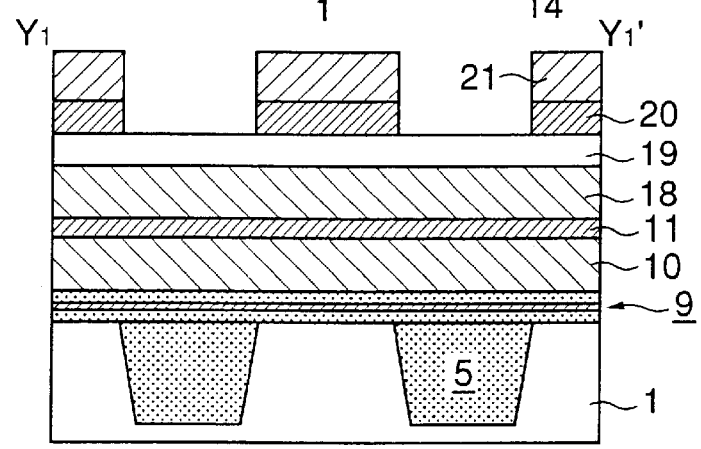
Figure 12:
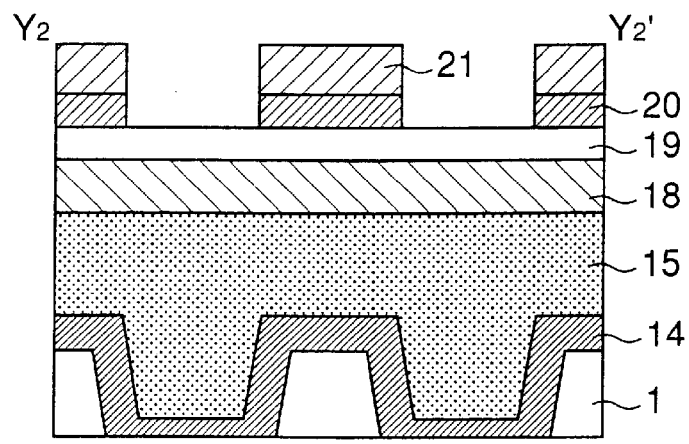
Figure 13:
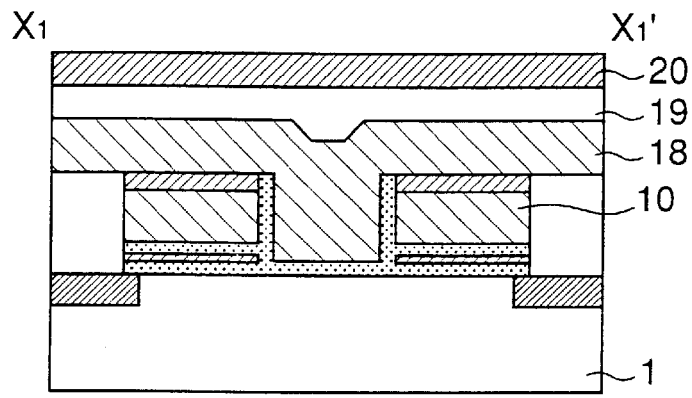
FIGS. 13(a) to 13(d) are schematic sectional views of a major part for illustrating a manufacturing process of the nonvolatile semiconductor memory device of FIG. 1.
Figure 13:
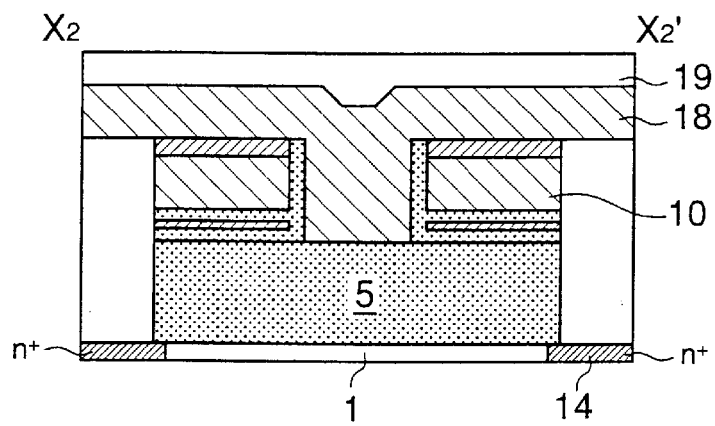
Figure 13:
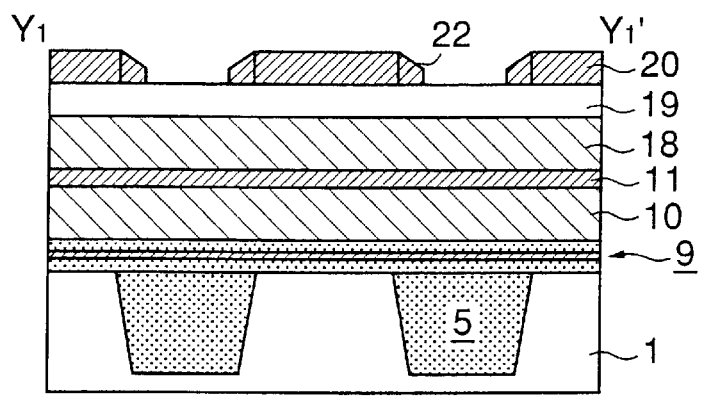
Figure 13:
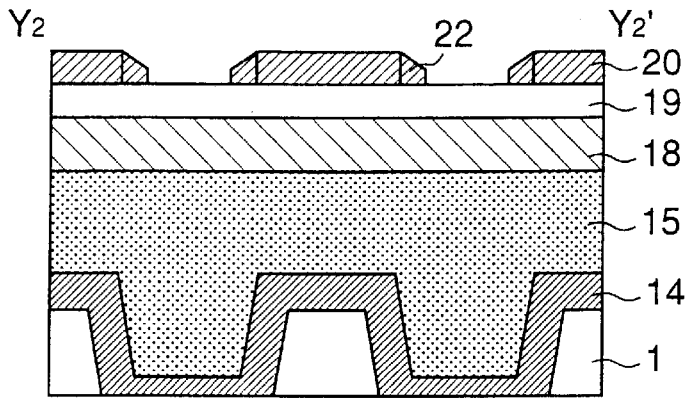
Figure 14:
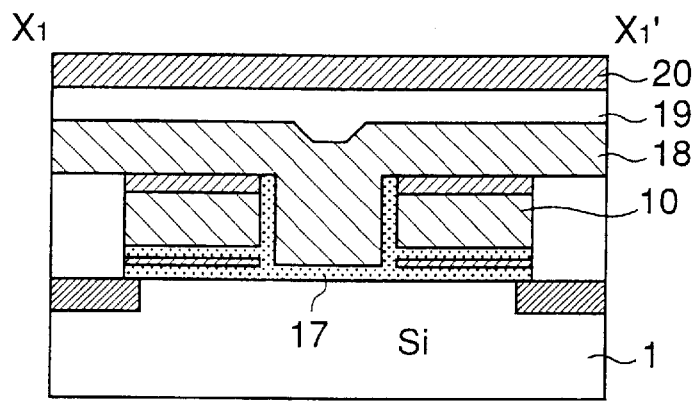
FIGS. 14(a) to 14(d) are schematic sectional views of a major part for illustrating a manufacturing process of the nonvolatile semiconductor memory device of FIG. 1.
Figure 14:
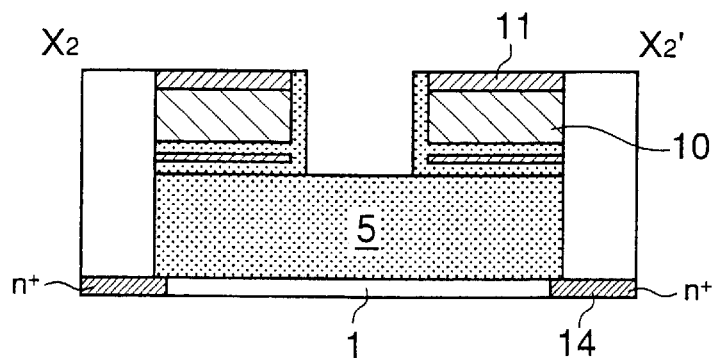
Figure 14:
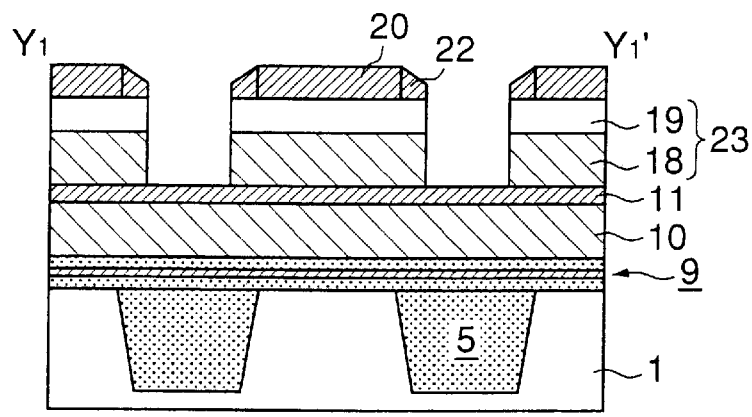
Figure 14:
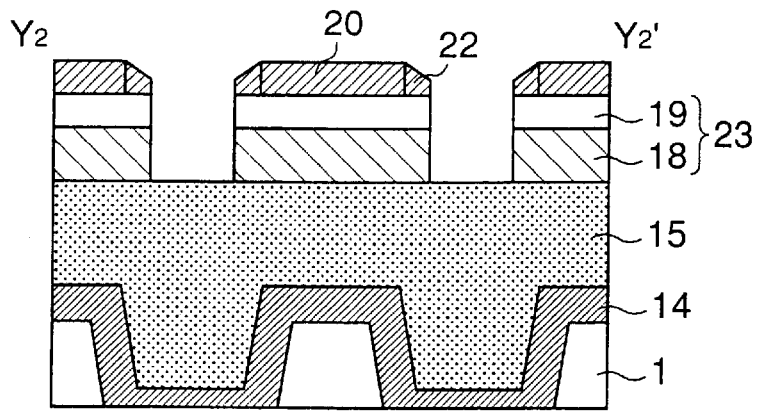
Figure 15:
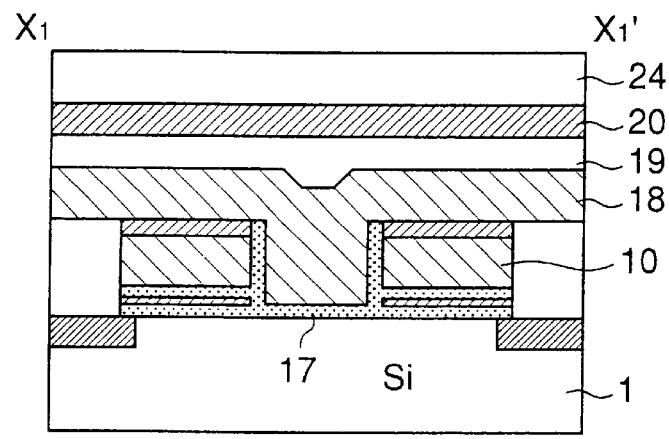
FIGS. 15(a) to 15(d) are schematic sectional views of a major part for illustrating a manufacturing process of the nonvolatile semiconductor memory device of FIG. 1.
Figure 15:
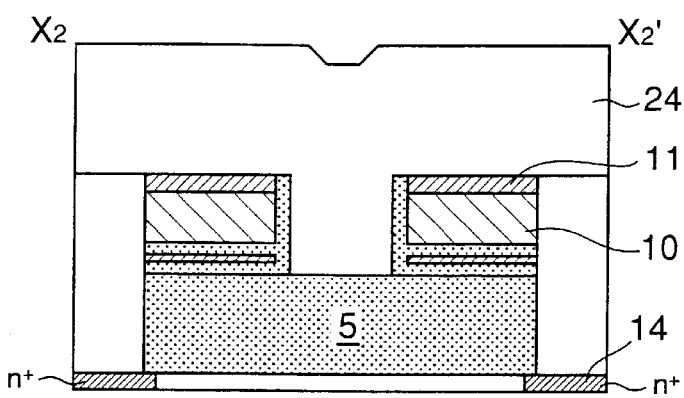
Figure 15:
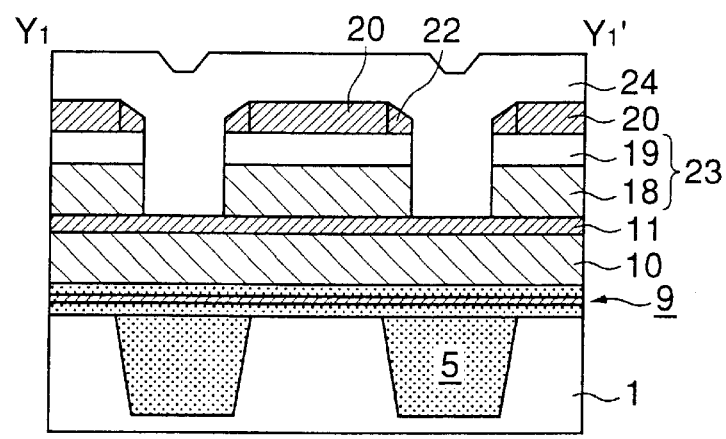
Figure 15:
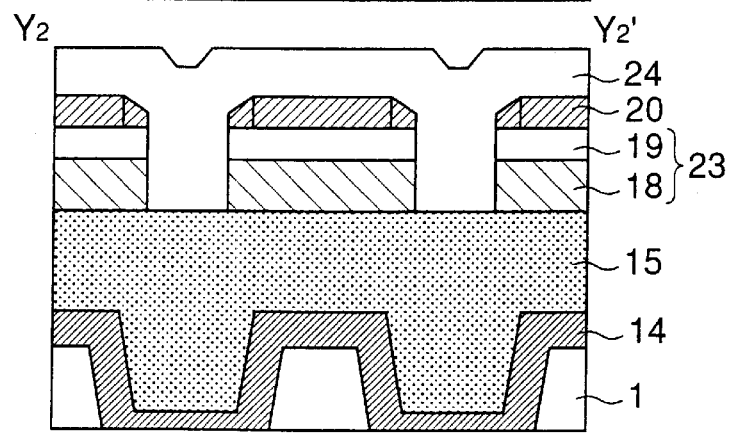

As shown in FIGS. 1(a) to 1(c), the nonvolatile semiconductor memory device according to the present invention comprises a pair of impurity diffusion layers which function as bit lines 14 formed in parallel to each other along the Y-axis on a surface of a silicon substrate 1, two control gates 10 formed in parallel to each other along the Y-axis between the impurity diffusion layers on the silicon substrate 1 through the intervention of an ONO film 9 so that the control gates are adjacent to the impurity diffusion layers, respectively, and a word gate transistor including a word line 23 extending along the X-axis over the control gates 10 through the intervention of an insulating film 11 and over the silicon substrate 1 between the control gates 10 through the intervention of a word gate insulating film 17.

In the nonvolatile semiconductor memory device, the two control gates 10 (e.g., CG1 and CG2) and one word gate transistor are connected in series to constitute a unit cell. A plurality of the unit cells are arranged in matrix.

Hereinafter, the process of manufacturing the nonvolatile semiconductor memory device according to the present invention shown in FIG. 1 will be detailed with reference to FIGS. 2 to 15. FIGS. 2(a) to 15(a) are sectional views cut along a line $X_1–X_1'$ shown in FIG. 1(a), FIGS. 2(b) to 15(b) are sectional views cut along a line $X_2–X_2'$ shown in FIG. 1(a), FIGS. 2(c) to 15(c) are sectional views cut along a line $Y_1–Y_1'$ shown in FIG. 1(a), and FIGS. 2(d) to 15(d) are sectional views cut along a line $Y_2–Y_2'$ shown in FIG. 1(a).

First, as shown in FIGS. 2(a) to 2(d), a silicon nitride film 2 is formed on a p-type silicon substrate 1. A resist is applied on the silicon nitride film 2 to form a resist pattern 3 having openings in regions for providing a shallow trench device isolation (STI) film. With the resist pattern 3 as a mask, the silicon nitride film 2 and the silicon substrate 1 are etched to form trenches for the STI film.

Then, as shown in FIGS. 3(a) to 3(d), the resist pattern 3 is removed and then a silicon oxide film is formed on the entire surface of the obtained silicon substrate 1. The silicon oxide film is etched back until the silicon nitride film 2 is exposed to bury the silicon oxide film in the trenches 4 to provide STI films 5. In this step, the silicon nitride film 2 is used as an etch stopper and a protection for active regions.

After removing, the silicon nitride film 2, an ONO film 9 comprising a silicon oxide film 8 of 5 nm thick/a silicon nitride film 7 of 7 nm thick/a silicon oxide film 6 of 5 nm thick, a polysilicon film 10a for control gates and a silicon nitride film 11 of 50 nm thick are successively formed on the entire surface of the obtained silicon substrate 1 as shown in FIGS. 4(a) to 4(d).

Then, as shown in FIGS. 5(a) to 5(d), a resist pattern 12 for forming the control gates is formed on the surface of the obtained silicon substrate 1. With the resist pattern 12 as a mask, the silicon nitride film 11, the polysilicon film 10a and the silicon oxide film 8 are etched to form control gates 10.

As shown in FIGS. 6(a) to 6(d), after removing the resist pattern 12, a resist pattern 13 for forming bit lines is formed on the obtained silicon substrate 1. With the resist pattern 13, the control gates 10 and the silicon nitride film 11 as a mask, the silicon nitride film 7, the silicon oxide film 6 and the STI film 5 existing in regions for forming the bit lines are etched away. In this step, the surface of the silicon nitride film 11 is also etched. However, the thickness thereof is relatively greater than that of the silicon nitride film 7 so that it partially remains on the control gates 10. With the resist pattern 13, the control gates 10 and the silicon nitride film 11 as a mask, arsenic ions are implanted in the surface of the silicon substrate 1 at an acceleration energy of 15 keV and a dose of $5\times10^{14}$.

After removing the resist pattern 13, annealing is carried out at about 800° C. for 30 minutes to restore crystallinity of silicon in the implanted region and to activate the implanted arsenic ions. Thus, bit lines 14 are formed as shown in FIGS. 7(a) to 7(d).

Then, as shown in FIGS. 8(a) to 8(d), an HDP (High Density Plasma) oxide film 15 is deposited on the entire surface of the obtained silicon substrate 1.

Thereafter, the HDP oxide film 15 is etched back until the silicon nitride film 11 is exposed. The silicon nitride film 11 serves as an etch stopper for the etch back step.

Then, as shown in FIGS. 9(a) to 9(d), a resist pattern 16 for forming a word gate insulating film is formed on the obtained silicon substrate 1. With the resist pattern 16 as a mask, the HDP oxide film 15 between the control gates 10 is etched away. In this step, the silicon nitride film 7 protects the STI film 5 buried in the trench from etching.

Further, the silicon nitride film 7 and the silicon oxide film 6 are removed. Thereafter, as shown in FIGS. 10(a) to 10(d), a word gate insulating film 17 is formed on the silicon substrate 1 between the control gates 10 and on the sidewalls of the control gates 10.

Then, as shown in FIGS. 11(a) to 11(d), a polysilicon film 18, a tungsten silicide film 19 and a silicon nitride film 20 are successively deposited on the obtained silicon substrate 1. The polysilicon film 18 is buried between the two control gates 10 as shown in FIGS. 11(a) and 11(b).

Then, as shown in FIGS. 12(a) to 12(d), a resist pattern 21 for forming word lines is formed on the silicon substrate 1 and the silicon nitride film 20 is patterned using the resist pattern 21 as a mask.

After removing the resist pattern 21, a silicon nitride film is further deposited on the silicon substrate 1 as shown in FIGS. 13(a) to 13(d). The silicon nitride film is etched back by RIE to form sidewall spacers 22 on the sidewalls of the silicon nitride film 20. The sidewall spacers will increase a margin for misalignment of the word lines and the active regions.

Then, as shown in FIGS. 14(a) to 14(d), the tungsten silicide film 19 and the polysilicon film 18 are etched using the silicon nitride film 20 and the sidewall spacers 22 as a mask to form word lines 23.

Thereafter, as shown in FIGS. 15(a) to 15(d), a BPSG film 24 is formed as a protective film on the silicon substrate 1 thus obtained.

According to the above-mentioned steps, the nonvolatile semiconductor memory device is completed.

Then, a process of data writing, erasing and reading of the nonvolatile semiconductor memory device according to the present invention will be detailed with reference to FIG. 16 and Tables 1 and 2.

Data Writing by Channel Hot Electron

To write data in a cell in a block wherein all cells are in an erasing state (a threshold voltage is negative), electrons are selectively injected only in a trap site of a nitride film between a control gate and a channel region of a cell in which data is to be written to change the threshold voltage to positive.

Figure 16:
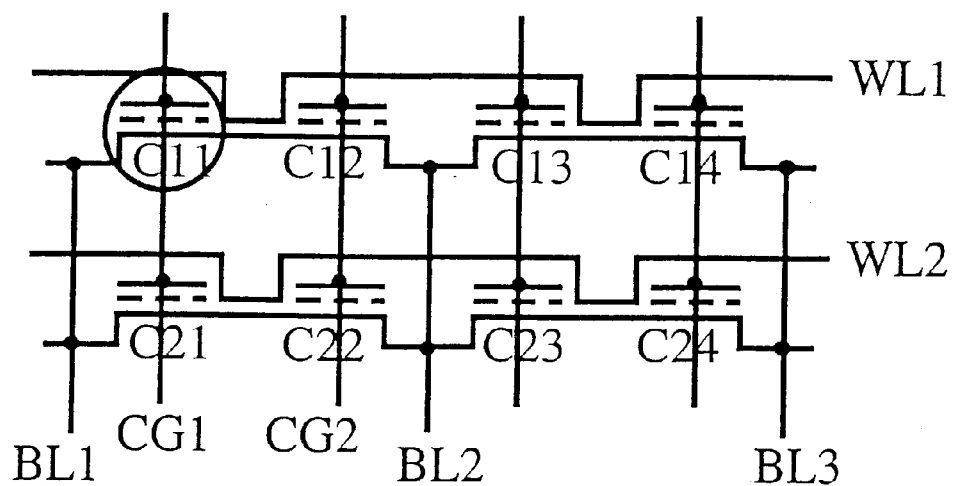
FIG. 16 is an equivalent circuit view of the nonvolatile semiconductor memory device of FIG. 1.

For example, to write data in a cell C11 shown in FIG. 16, voltages of 5V and 0V are applied to bit lines BL1 and BL2, respectively, as indicated in Table 1. Further, voltages of 5V and 3V are applied to a control gate CG2 and a word line WL1 (a selected gate), respectively. Accordingly, an electric potential of 0V of the bit line BL2 is transmitted to a channel region between a cell C12 and the selected gate (WL1). At this stage, the voltage of the control gate CG2 needs to be higher than a threshold voltage of the cell C12 in a writing state. By applying such a voltage to the control gate CG2, a channel region below the control gate CG2 is inverted. As a result, the potential of 0V of the bit line BL2 is transmitted to a source of the cell C11. Further, by applying 5V to the control gate CG1, an inversion layer is formed in the channel region of the cell C11, so that electrons flow from the channel region of the control gate near the source at 0V to the bit line BL1 near the drain at 5V. At this stage, a depletion layer is generated near the drain (pinch-off) by establishing the voltage of the control gate $\approx$ the voltage of the drain (the BL1), which enlarges a lateral electric field. Electrons accelerated by the lateral electric field and gained energy to pass through an energy barrier of the oxide film are injected in the nitride film between the control gate CG1 and the channel region, which turns the threshold voltage to positive. Thus, data writing is carried out.

The data writing method is generally called as channel hot electron injection.

TABLE 1

|  | WL1 | WL2 | CG1 | CG2 | BL1 | BL2 | Sub |
|---|---|---|---|---|---|---|---|
| Writing | +3V | 0V | +5V | +5V | +5V | 0V | 0V |
| Erasing | 0V | 0V | −5V | −5V | +5V | +5V | 0V |
| Reading | +3V | 0V | +0V | +3V | 0V | +1V | 0V |

Data Writing by Source Side Injection

To write data in a cell in a block wherein all cells are in an erasing state (a threshold voltage is negative), electrons are selectively injected only in a trap site of a nitride film between a control gate and a channel region of a cell in which data is to be written to change the threshold voltage to positive.

For example, to write data in the cell C11 shown in FIG. 16, voltages of 5V and 0V are applied to the bit lines BL1 and the BL2, respectively as indicated in Table 2. A voltage of 5V is applied to the control gate CG2. Accordingly, an inversion layer is generated and the potential of 0V of the bit line BL2 is transmitted to a channel region of a cell C12. At this stage, the voltage of the control gate CG2 needs to be higher than a threshold voltage of the cell C12 in a writing state. Further, by applying 10V to the control gate CG1, an inversion layer is generated and the potential of 5V of the bit line BL1 is transmitted to a channel region of the cell C11.

Then, by applying 1V to the word line WL1, a depletion layer is generated between the channel regions of the cell C11, which enlarges the lateral electric field. Then, to improve injection efficiency, a threshold voltage of the selected gate needs to be applied to the word line (a voltage below the threshold voltage does not generate current flow and a voltage near the threshold voltage generates hot electrons to the maximum). Further, since the voltage of the control gate CG1 is 10V, which is higher than the voltage of 5V applied to the drain (BL1), the electric field in the ONO film of the cell C11 functions along a direction of collecting electrons. Therefore, electrons accelerated by the lateral electric field and gained energy to pass through an energy barrier of the oxide film are efficiently injected to the nitride film between the control gate CG1 and the channel region. Thus, the threshold voltage is changed to positive.

The data writing method is generally called to source-side-injection. The injection efficiency thereof is higher by about three digits than the channel hot electron described above.

TABLE 2

|  | WL1 | WL2 | CG1 | CG2 | BL1 | BL2 | Sub |
|---|---|---|---|---|---|---|---|
| Writing | +1V | 0V | +10V | +5V | +5V | 0V | 0V |
| Erasing | 0V | 0V | −10V | −10V | Float | Float | 0V |
| Reading | +3V | 0V | +0V | +3V | +1V | 0V | 0V |

Data Erasing by Hot Hole

To erase data from the cells C11, C12, C21 and C22 at the same time, 5V is applied to the control gates CG1 and CG2, respectively, and +5V is applied to the bit lines BL1 and BL2, respectively. Other terminals are fixed to GND. Current between bands is generated near the drain and holes accelerated through the lateral electric field and thus turned to hot holes are injected in a trap site of the nitride film. As a result, the holes are accumulated in the nitride film between the control gate and the channel region, which reduces the threshold voltage of the cell to 0V or less, i.e., provides an erasing state.

The data erasing method can also erase data from only the cells C11 and C21 connected to the bit line BL1. In this case, 0V is applied to the control gate CG2 and 0V is applied to the bit line BL2 or the bit line BL2 is floated. Other terminals are the same as described above. The data erasing at the minimum is carried out on the bit line basis.

FN Erasing

To erase data from the cells C11, C12, C21 and C22 at the same time, −10V is applied to the control gates CG1 and CG2, respectively. The bit lines BL1 and BL2 are both floated and 0V is applied to the word line and the substrate, respectively. Then, a high voltage is applied to the ONO film between the control gate and the silicon substrate and electrons that have been trapped in the nitride film are withdrawn to the silicon substrate by FN tunneling effect, which reduces the threshold voltage of the cell to 0V or less, i.e., provides an erasing state.

The data erasing method can also erase data from only the cells C11 and C21 connected to the control gate CG1. The data erasing at the minimum is carried out on the control gate basis.

Data Reading

Voltages of 1V and 0V are applied to the bit lines BL1 and BL2, respectively +5V is applied to the control gate CG2 and +3V is applied to the word line WL to turn the cell C12 and the selected gate on. At this stage, the voltage applied to the control gate CG2 needs to be higher than the threshold voltage of the cell C12 in a writing state and the voltage applied to the WL needs to be higher than the threshold voltage of the selected gate. Then, 0V is applied to the control gate CG1 to observe whether the electric current flows or not to determine whether the selected cell is in a writing state or an erasing state.

According to the present invention, provided is a non-volatile semiconductor memory device comprising: a pair of impurity diffusion layers formed on a surface of a semiconductor substrate; two control gates formed on the semiconductor substrate through the intervention of a charge accumulating layer, the two control gates being provided between the impurity diffusion layers to be adjacent to the impurity diffusion layers, respectively; a word gate transistor including a word line formed on the semiconductor substrate through the intervention of a word gate insulating film between the control gates, wherein the two control gates and the word gate transistor are connected in series to form a unit cell. Alternatively, the invention provides a nonvolatile semiconductor memory device comprising: a pair of impurity diffusion layers formed parallel to each other along the Y-axis on a surface of a semiconductor substrate to function as bit lines; two control gates formed parallel to each other along the Y-axis on the semiconductor substrate through the intervention of a charge accumulating layer, the two control gates being provided between the pair of impurity diffusion layers to be adjacent to the impurity diffusion layers, respectively; and a word gate transistor including a word line extending along the X-axis, the word line being formed on the control gates through the intervention of an insulating film and on the semiconductor substrate between the control gates through the intervention of a word gate insulating film, wherein the two control gates and the word gate transistor are connected in series to form a plurality of unit cells. Therefore, 2-bit data corresponding to the two control gates is controlled by different control gate voltages, which improves reading precision. Further, lateral movement of electrons and holes is prevented so that reliability in data storing is improved. Moreover, data writing and erasing are surely controlled so that operation speed can be raised.

In particular, where the nitride film in the ONO film located below the two control gates is split by the word gate insulating film, the selected cell is prevented from being influenced by an adjacent unselected cell. In comparison with a nonvolatile semiconductor device utilizing floating gates, a step of manufacturing the floating gates is omitted while maintaining the same cell area of 4F2. Accordingly the nonvolatile semiconductor memory device of the present invention can be formed by common process of manufacturing transistors while reducing masking steps. Further, a cell area of 2F2 can be achieved by providing a multivalued device.

Further, according to the process of manufacturing the nonvolatile semiconductor memory device of the present invention, the above-mentioned device with improved reliability can easily be manufactured.

Still further, according to the method of operating the nonvolatile semiconductor memory device of the present invention, 2-bit data corresponding to the two control gates is controlled by different control gate voltages, which improves reading precision. Moreover, when data writing is carried out by source side injection, writing speed increases by three or more digits as compared with data writing by the channel hot electron injection.

What is claimed is:

1. A nonvolatile semiconductor memory device comprising:

a pair of impurity diffusion layers formed on a surface of a semiconductor substrate;

first and second control gates formed on the semiconductor substrate through the intervention of a charge accumulating layer, the first and second control gates being provided between the impurity diffusion layers to be adjacent to the impurity diffusion layers, respectively;

a word gate transistor including a word line formed on the semiconductor substrate through the intervention of a word gate insulating film between the control gates, wherein the first and second control gates and the word gate transistor are connected in series to form a unit cell, and wherein the word line overlaps each of the first and second control gates across their entire respective widths.

2. A nonvolatile semiconductor memory device according to claim 1, wherein the pair of impurity diffusion layers are formed parallel to each other along the Y-axis to function as bit lines;

the first and second control gates are formed parallel to each other along the Y-axis on the semiconductor substrate through the intervention of the charge accumulating layer, the two control gates being provided between the pair of impurity diffusion layers to be adjacent to the impurity diffusion layers, respectively; and the word gate transistor includes the word line extending along the X-axis, the word line being formed on the control gates through the intervention of an insulating film and covering the control gates completely in the x-axis direction and being provided at least on the semiconductor substrate between the control gates.

3. A nonvolatile semiconductor memory device according to claim 1, wherein the charge accumulating layer comprises a nitride film and the nitride film is divided by the word gate insulating film to provide below the two control gates.

4. A nonvolatile semiconductor memory device according to claim 1, wherein the charge accumulating layer is a silicon oxide film/a silicon nitride film/a silicon oxide film.

5. The memory device of claim 1, further comprising first and second bit lines corresponding to different ones of the pair of impurity diffusion layers, respectively, wherein the bit lines are parallel to the first and second control gates.

6. The memory device of claim 1, wherein the charge accumulating layer is a single layered film or a layered film made of silicon oxide and/or silicon nitride.

7. A nonvolatile semiconductor memory device comprising:

a pair of impurity diffusion layers formed on a surface of a semiconductor substrate;

first and second control gates each formed on the semiconductor substrate through the intervention of a respective charge accumulating layer, the first and second control gates being provided between the impurity diffusion layers to be adjacent to the impurity diffusion layers, respectively;

a word gate transistor including a word line formed on the semiconductor substrate through the intervention of a word gate insulating film between the control gates, wherein the and second control gates and the word gate transistor are connected in series to form a unit cell, and wherein the charge accumulation layer comprises silicon oxide and/or silicon nitride.

8. A nonvolatile semiconductor memory device according to claim 7, wherein the charge accumulating layer comprises a nitride film and the nitride film is divided into two portions by the word gate insulating film, the two portions of the charge accumulating layer being located at least partially below the two respective control gates.

9. A nonvolatile semiconductor memory device according to claim 7, wherein the charge accumulating layer comprises a silicon oxide film/a silicon nitride film/a silicon oxide film.

10. A nonvolatile semiconductor memory device according to claim 7, wherein the pair of impurity diffusion layers are formed parallel to each other along the Y-axis to function as bit lines;

the first and second control gates are formed parallel to each other along the Y-axis on the semiconductor substrate through the intervention of the charge accumulating layer, the two control gates being provided between the pair of impurity diffusion layers to be adjacent to the impurity diffusion layers, respectively; and the word gate transistor includes the word line extending along the X-axis, the word line being formed on the control gates through the intervention of an insulating film and covering the control gates completely in the x-axis direction and being provided at least on the semiconductor substrate between the control gates.

* * * * *